US009812501B2

(12) United States Patent
Lee et al.

(10) Patent No.: US 9,812,501 B2
(45) Date of Patent: Nov. 7, 2017

(54) VARIABLE RESISTANCE MEMORY DEVICES AND METHODS OF MANUFACTURING THE SAME

(71) Applicants: Jin-Woo Lee, Hwaseong-si (KR);
Youn-Seon Kang, Yongin-si (KR);
Seung-Jae Jung, Suwon-si (KR);
Hyun-Su Ju, Hwaseong-si (KR);
Masayuki Terai, Suwon-si (KR)

(72) Inventors: Jin-Woo Lee, Hwaseong-si (KR);
Youn-Seon Kang, Yongin-si (KR);
Seung-Jae Jung, Suwon-si (KR);
Hyun-Su Ju, Hwaseong-si (KR);
Masayuki Terai, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 14/984,477

(22) Filed: Dec. 30, 2015

(65) Prior Publication Data

US 2016/0197121 A1    Jul. 7, 2016

(30) Foreign Application Priority Data

Jan. 5, 2015   (KR) .................... 10-2015-0000571

(51) Int. Cl.
*H01L 27/24*    (2006.01)
*H01L 43/08*    (2006.01)
(Continued)

(52) U.S. Cl.
CPC ........ *H01L 27/2463* (2013.01); *H01L 27/224* (2013.01); *H01L 27/2409* (2013.01); *H01L 43/12* (2013.01); *H01L 45/1675* (2013.01)

(58) Field of Classification Search
CPC ... H01L 27/2463; H01L 27/222; H01L 43/02; H01L 43/08; H01L 45/1233
(Continued)

(56) References Cited

U.S. PATENT DOCUMENTS 6,984,585 B2    1/2006   Ying et al.
7,169,637 B2    1/2007   Zhang et al.
(Continued)

FOREIGN PATENT DOCUMENTS

JP    6-151783 A    5/1994
JP    5-235307 A    7/2013
(Continued)

*Primary Examiner* — Cuong Q Nguyen
*Assistant Examiner* — Tong-Ho Kim
(74) *Attorney, Agent, or Firm* — Harness, Dickey & Pierce, P.L.C.

(57) ABSTRACT

A variable resistance memory device includes a plurality of first conductive layer pattern, a plurality of second conductive layer patterns over the first conductive layer patterns, and a plurality of lower cell structures including a switching element and a variable resistance element, the lower cell structures being formed at intersections at which the first conductive layer patterns and the second conductive layer patterns overlap each other. The first conductive layer patterns, the second conductive layer patterns and the lower cell structures serves as one of a memory cell, a first dummy pattern structure and a second dummy pattern structure. The first dummy pattern structure is formed on both edge portions in the first direction, and the second conductive layer pattern of the first dummy pattern structure protrudes in the first direction from a sidewall of the lower cell structure thereunder, and the second dummy pattern structure is formed on both edge portions in the second direction, and the first conductive layer pattern of the second dummy pattern structure protrudes in the second direction from a sidewall of the lower cell structure thereon. Failures of the variable resistance memory device due to the etch residue may decrease.

20 Claims, 38 Drawing Sheets

(51) Int. Cl.
*H01L 43/02* (2006.01)
*H01L 43/12* (2006.01)
*H01L 45/00* (2006.01)
*H01L 27/22* (2006.01)

(58) Field of Classification Search
USPC .......................................... 257/4, 2; 438/282
See application file for complete search history.

(56) References Cited

U.S. PATENT DOCUMENTS

| | | | |
|---|---|---|---|
| 7,320,942 B2* | 1/2008 | Chen | H01L 21/02071 257/E21.256 |
| 7,863,060 B2 | 1/2011 | Belen et al. | |
| 8,581,225 B2 | 11/2013 | Himeno et al. | |
| 2006/0141776 A1 | 6/2006 | Jo | |
| 2008/0087633 A1 | 4/2008 | Oh et al. | |
| 2012/0100706 A1 | 4/2012 | Sim et al. | |
| 2013/0069029 A1* | 3/2013 | Kuniya | H01L 27/2481 257/2 |

FOREIGN PATENT DOCUMENTS

| | | |
|---|---|---|
| KR | 2006-0062491 A | 6/2006 |
| KR | 2006-0075100 A | 7/2006 |
| KR | 2008-0033589 A | 4/2008 |
| KR | 20100053856 A | 5/2010 |
| KR | 2012-0041558 A | 5/2012 |

\* cited by examiner

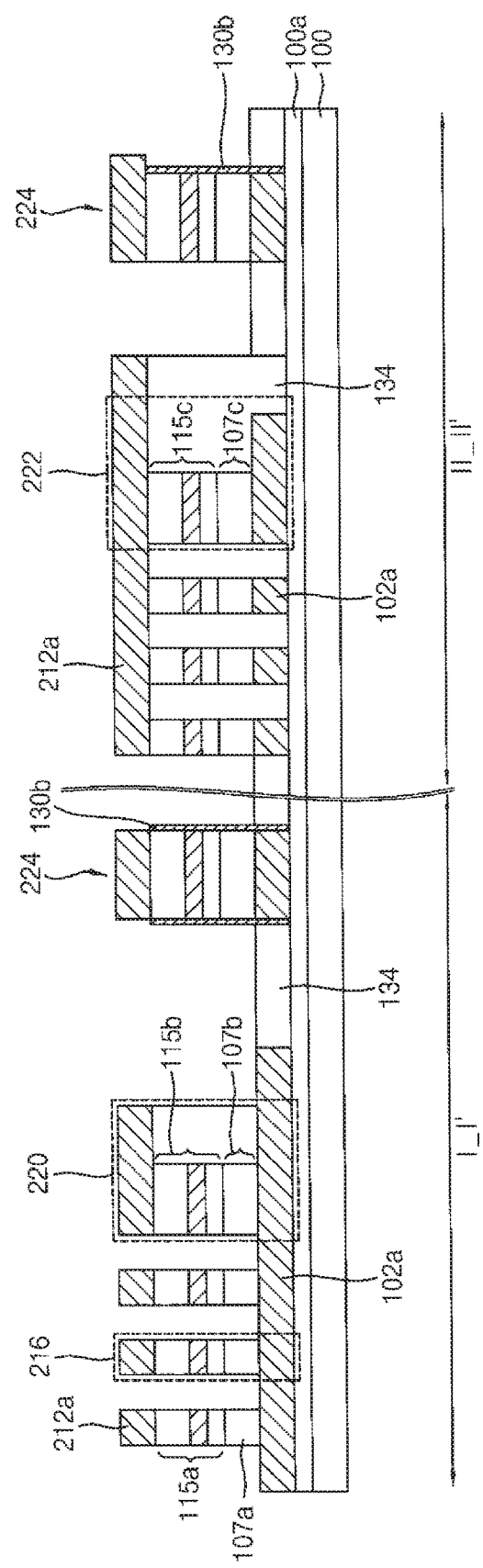

US 9,812,501 B2

VARIABLE RESISTANCE MEMORY DEVICES AND METHODS OF MANUFACTURING THE SAME

CROSS-REFERENCE TO RELATED APPLICATION

This application claims priority under 35 USC §119 to Korean Patent Application No. 10-2015-0000571, filed on Jan. 5, 2015, in the Korean Intellectual Property Office (KIPO), the entire contents of which are incorporated herein by reference.

BACKGROUND

Field

One or more example embodiments relate to semiconductor devices and/or methods of manufacturing the same. More particularly, one or more example embodiments relate to variable resistance memory devices and/or methods of manufacturing the same.

Description of the Related Art

Recently, memory devices having variable resistance properties have been developed. Examples of conventional variable resistance memory devices include resistive random access memory (ReRAM) devices, phase change random access memory (PRAM) devices, magnetic random access memory (MRAM) devices, etc.

SUMMARY

One or more example embodiments provide variable resistance memory devices having improved characteristics.

One or more example embodiments provide methods of manufacturing variable resistance memory devices having improved characteristics.

At least one example embodiment provides a variable resistance memory device. The variable resistance memory device includes: a plurality of first conductive layer patterns extending in a first direction; a plurality of second conductive layer patterns over the plurality of first conductive layer patterns, the plurality of second conductive layer patterns extending in a second direction crossing the first direction; and a plurality of lower cell structures including a switching element and a variable resistance element, the plurality of lower cell structures being formed at intersections at which the plurality of first conductive layer patterns and the plurality of second conductive layer patterns overlap each other. The plurality of first conductive layer patterns, the plurality of second conductive layer patterns and the plurality of lower cell structures serve as one of a memory cell, a first dummy pattern structure and a second dummy pattern structure. The first dummy pattern structure is formed on first edge portions in the first direction, and the second conductive layer pattern of the first dummy pattern structure protrudes in the first direction from a sidewall of the lower cell structure thereunder. The second dummy pattern structure is formed on second edge portions in the second direction, and the first conductive layer pattern of the second dummy pattern structure protrudes in the second direction from a sidewall of the lower cell structure thereon.

In at least some example embodiments, the second conductive layer pattern of the memory cell may have a second width in the first direction, and the second conductive layer pattern of the first dummy pattern structure may have a fourth width in the first direction greater than the second width.

In example embodiments, the lower cell structure of the memory cell may have the second width in the first direction, and the lower cell structure of the second dummy pattern structure may have a third width in the first direction greater than the second width.

In example embodiments, the first conductive layer pattern of the memory cell may have a first width in the second direction, and the first conductive layer pattern of the second dummy pattern structure may have a third width in the first direction greater than the first width.

In example embodiments, the lower cell structure of the memory cell may have the first width in the first direction, and the lower cell structure of the second dummy pattern structure may have a seventh width in the first direction greater than the first width.

In example embodiments, the first conductive layer pattern of the first dummy pattern structure may extend in the first direction to protrude from sidewalls of the lower cell structures thereon.

In example embodiments, the second conductive layer pattern of the second dummy pattern structure may extend in the second direction to protrude from sidewalls of the lower cell structures thereunder.

In example embodiments, the variable resistance memory device further includes a plurality of third conductive layer patterns over the second conductive layer patterns, the third conductive layer patterns extending in the first direction, and a plurality of upper cell structures including a switching element and a variable resistance element, the upper cell structures being formed at intersections at which the second conductive layer patterns and the third conductive layer patterns overlap each other.

In example embodiments, the third conductive layer pattern of the first dummy pattern structure may extend in the first direction to protrude from sidewalls of the upper cell structures thereunder.

In example embodiments, the first and third conductive layer patterns may overlap each other.

In example embodiments, the third conductive layer pattern of the second dummy pattern structure may protrude in the second direction from a sidewall of the upper cell structure thereon.

In example embodiments, the variable resistance memory device further includes a dishing prevention blocking pattern on a region surrounding a pattern structure including the first conductive layer patterns, the second conductive layer patterns and the lower cell structures.

In example embodiments, the dishing prevention blocking pattern may have a pillar shape.

In example embodiments, an etch residue may be attached on a sidewall of the dishing prevention blocking pattern.

In example embodiments, the variable resistance layer pattern may include a perovskite-based material or a transition metal oxide.

According to example embodiments, there is provided a variable resistance memory device. The variable resistance memory device includes a substrate including a cell region and a dummy region adjacent to an edge portion of the cell region, a plurality of first conductive layer patterns extending in a first direction, a plurality of lower cell structures including a switching element and a variable resistance element on the first conductive layer patterns, the lower cell structures having a pillar shape, and a plurality of second conductive layer patterns on the lower cell structures, the second conductive layer patterns extending in a second direction crossing the first direction. The first conductive layer patterns, the second conductive layer patterns and the lower cell structures define a pattern structure. At least one of the first and second conductive layer patterns of the pattern structure on the dummy region has a shape different from a shape of the first and second conductive layer patterns of the pattern structure on the cell region.

In example embodiments, the second conductive layer pattern on an edge portion in the first direction of the dummy region may have s a shape different from a shape of the second conductive layer pattern of on the cell region, and wherein the first conductive layer pattern on an edge portion in the second direction of the dummy region may have a shape different from a shape of the first conductive layer pattern on the cell region.

In example embodiments, the second conductive layer pattern on an edge portion in the first direction of the dummy region may have a width in the first direction greater than a width in the first direction of the second conductive layer pattern on the cell region.

In example embodiments, the first conductive layer pattern on an edge portion in the second direction of the dummy region may have a width in the second direction greater than a width in the second direction of the first conductive layer pattern on the cell region.

In example embodiments, the second conductive layer pattern on an edge portion in the first direction of the dummy region may protrude in the first direction from a sidewall of the lower cell structure thereunder.

In example embodiments, the first conductive layer pattern on an edge portion in the second direction of the dummy region may protrude in the second direction from a sidewall of the lower cell structure thereon.

In example embodiments, each of the pattern structures on the dummy region may have a stacked structure substantially the same as a stacked structure of each of the pattern structures on the cell region.

In example embodiments, portions of the pattern structure on the dummy region may have a stacked structure different from a stacked structure of portions of the pattern structure on the cell region.

In example embodiments, at least a portion of the pattern structure on edge portions in the first and second directions of the dummy region may include the first conductive layer pattern, an insulation pattern and the second conductive layer pattern sequentially stacked.

According to example embodiments, there is provided a method of manufacturing a variable resistance memory device. In the method, a plurality of preliminary cell structures and a preliminary dummy cell structures extending in a first direction are formed on a first region of a substrate, each of the preliminary cell structures and the preliminary dummy cell structures including a first conductive layer pattern, a preliminary switching element and a preliminary variable resistance layer pattern sequentially stacked, the preliminary cell structure having a first width, and the preliminary dummy pattern structure having a third width greater than the first width. Portions of the preliminary cell structures and the preliminary dummy cell structures on edge portions of the first region are selectively etched to expose the first conductive layer patterns. A plurality of second conductive layer patterns and a plurality of second dummy conductive layer patterns are formed on the preliminary cell structures and the preliminary dummy cell structures, the second conductive layer patterns and the second dummy conductive layer patterns extending in a second direction crossing the first direction, each of the second conductive layer patterns having a second width, and each of the second dummy second conductive layer patterns having a fourth width greater than the second width. The preliminary variable resistance layer pattern and the preliminary switching element pattern between the second conductive layer patterns and the second dummy conductive layer patterns are etched until the first conductive layer patterns are exposed to form a plurality of lower memory cells and a plurality of dummy pattern structures, each of the lower memory cells and the dummy pattern structures including the first conductive layer pattern, a variable resistance layer pattern, a switching element pattern and the second conductive layer pattern sequentially stacked.

In example embodiments, the preliminary dummy cell structures may be formed on edge portions in the second direction of the first region.

In example embodiments, the second dummy conductive layer patterns may be formed on edge portions in the first direction of the first region.

In example embodiments, selectively etching the portions of the preliminary cell structures and the preliminary dummy cell structures on edge portions of the first region may include removing etch residues on sidewalls of the preliminary cell structures and the preliminary dummy cell structures.

In example embodiments, after forming the lower memory cells and the dummy pattern structures, a plurality of upper memory cells and a plurality upper dummy pattern structures may be formed, wherein each of the upper memory cells may include a second switching element, a second variable resistance layer pattern and a third conductive layer pattern extending in the first direction, and each of the upper dummy pattern structures may include the second switching element, the second variable resistance layer pattern and a third dummy conductive layer pattern extending in the first direction.

In example embodiments, the third conductive layer pattern and the third dummy conductive layer pattern may be formed to overlap the first conductive layer pattern and the first dummy conductive layer pattern, respectively.

In example embodiments, when the plurality of upper memory cells and the plurality of upper dummy pattern structures are formed, a plurality of second preliminary cell structures and a plurality of second preliminary dummy pattern structures extending in the first direction may be formed on the lower memory cells and the dummy pattern structures. Each of the second preliminary cell structures and the second preliminary dummy cell structures may include a second preliminary switching element and a second preliminary variable resistance layer pattern sequentially stacked, the second preliminary cell structure may have the first width, and the second preliminary dummy pattern structure may have the third width greater than the first width. Portions of the second preliminary cell structures and the second preliminary dummy cell structures on edge portions of the first region are selectively etched to expose the second conductive layer patterns. A plurality of third conductive layer patterns and a plurality of third dummy conductive layer patterns are formed on the preliminary cell structures and the preliminary dummy cell structures. The third conductive layer patterns and the third dummy conductive layer patterns may extend in the second direction, each of the third conductive layer patterns may have the first width, and each of the third dummy second conductive layer patterns may have a fifth width greater than the first width. The second preliminary variable resistance layer pattern and the second preliminary switching element pattern between the third conductive layer patterns and third dummy conductive layer patterns may be etched to expose the second conductive layer patterns.

In example embodiments, when the portions of the second preliminary cell structures and the second preliminary dummy cell structures on edge portions of the first region are etched, etch residues on sidewalls of the second preliminary cell structures and the second preliminary dummy cell structures may be removed.

In example embodiments, when the variable resistance memory device is manufactured, a dishing prevention blocking pattern including the lower memory cells and the dummy pattern structures may be formed on a region surrounding a pattern structure.

According to at least one other example embodiment, a variable resistance memory device comprises: a plurality of first conductive layer patterns extending in a first direction; a plurality of second conductive layer patterns over the plurality of first conductive layer patterns, the plurality of second conductive layer patterns extending in a second direction to cross the plurality of first conductive layer patterns; and a plurality of lower cell structures formed at intersections of the plurality of first conductive layer patterns and the plurality of second conductive layer patterns, each of the plurality of lower cell structures including a lower switching element and a lower variable resistance element; wherein the plurality of first conductive layer patterns, the plurality of second conductive layer patterns and the plurality of lower cell structures form a plurality of pattern structures, each of the plurality of pattern structures serving as one of a memory cell, a first dummy pattern structure and a second dummy pattern structure of the variable resistance memory device; wherein the first dummy pattern structure is formed on at least a first edge portion in the first direction, and a second conductive layer pattern of the first dummy pattern structure protrudes in the first direction from a sidewall of a lower cell structure of the first dummy pattern structure; and wherein the second dummy pattern structure is formed on at least a second edge portion in the second direction, and a first conductive layer pattern of the second dummy pattern structure protrudes in the second direction from a sidewall of a lower cell structure of the second dummy pattern structure.

According to at least some example embodiments, a second conductive layer pattern of the memory cell may have a first width in the first direction, and the second conductive layer pattern of the first dummy pattern structure may have a second width in the first direction, the second width being greater than the first width.

A lower cell structure of the memory cell may have the first width in the first direction, and the lower cell structure of the second dummy pattern structure may have a third width in the first direction, the third width being greater than the first width.

A first conductive layer pattern of the memory cell may have a first width in the second direction, and the first conductive layer pattern of the second dummy pattern structure may have a second width in the first direction, the second width being greater than the first width.

A lower cell structure of the memory cell may have the first width in the first direction, and the lower cell structure of the second dummy pattern structure may have a third width in the first direction, the third width being greater than the first width.

A first conductive layer pattern of the first dummy pattern structure may extend in the first direction to protrude from sidewalls of the lower cell structure of the first dummy pattern structure.

A second conductive layer pattern of the second dummy pattern structure may extend in the second direction to protrude from sidewalls of the lower cell structure of the second dummy pattern structure.

The plurality of pattern structures may include: a plurality of third conductive layer patterns over the plurality of second conductive layer patterns, the plurality of third conductive layer patterns extending in the first direction; and a plurality of upper cell structures at intersections of the plurality of second conductive layer patterns and the plurality of third conductive layer patterns, each of the plurality of upper cell structures including an upper switching element and an upper variable resistance element.

A third conductive layer pattern of the first dummy pattern structure may extend in the first direction to protrude from sidewalls of an upper cell structure of the first dummy pattern structure.

The first plurality of conductive layer patterns and the third plurality of conductive layer patterns may overlap each other.

A third conductive layer pattern of the second dummy pattern structure may protrude in the second direction from a sidewall of an upper cell structure of the second dummy pattern structure.

The variable resistance memory device may further include: a dishing prevention blocking pattern on a region surrounding the plurality of pattern structures. The dishing prevention blocking pattern may have a pillar shape.

An etch residue may remain on a sidewall of the dishing prevention blocking pattern.

The lower variable resistance element may include a first electrode, a variable resistance layer pattern and a second electrode that are sequentially stacked.

The variable resistance layer pattern may include a perovskite-based material or a transition metal oxide.

At least one other example embodiment provides a variable resistance memory device, comprising: a substrate including a cell region and a dummy region adjacent to an edge portion of the cell region; a plurality of first conductive layer patterns extending in a first direction; a plurality of lower cell structures on the plurality of first conductive layer patterns, each of the plurality of lower cell structures including a lower switching element and a lower variable resistance element, and each of the plurality of lower cell structures having a pillar shape; and a plurality of second conductive layer patterns on the plurality of lower cell structures, the plurality of second conductive layer patterns extending in a second direction; wherein the second direction crosses the first direction; wherein the plurality of first conductive layer patterns, the plurality of second conductive layer patterns and the plurality of lower cell structures define a pattern structure; and wherein a shape of at least one of a first conductive layer pattern and a second conductive layer pattern on the dummy region is different from a shape of at least one of a first conductive layer pattern and a second conductive layer pattern on the cell region.

The second conductive layer pattern on the dummy region may be at an edge portion of the dummy region in the first direction, and the shape of the second conductive layer pattern on the dummy region may be different from the shape of the second conductive layer pattern on the cell region; and the first conductive layer pattern on the dummy region may be at an edge portion of the dummy region in the second direction, and the shape of the first conductive layer pattern on the dummy region may be different from the shape of the first conductive layer pattern on the cell region.

The second conductive layer pattern on the dummy region may be at an edge portion of the dummy region in the first direction; and a width of the second conductive layer pattern on the dummy region in the first direction may be greater than a width of the second conductive layer pattern on the cell region in the first direction.

The first conductive layer pattern on the dummy region may be at an edge portion of the dummy region in the second direction; and a width of the first conductive layer pattern on the dummy region in the second direction may be greater than a width of the first conductive layer pattern on the cell region in the second direction.

The second conductive layer pattern on the dummy region may be at an edge portion of the dummy region in the first direction; and the second conductive layer pattern on the dummy region may protrude in the first direction from a sidewall of a lower cell structure under the second conductive layer pattern on the dummy region.

The first conductive layer pattern on the dummy region may be at an edge portion of the dummy region in the second direction; and the first conductive layer pattern on the dummy region may protrude in the second direction from a sidewall of a lower cell structure on the first conductive layer pattern.

At least a portion of the pattern structure on the dummy region may have a first stacked structure; at least a portion of the pattern structure on the cell region may have a second stacked structure; and the first and second stacked structures may be the same, substantially the same or different.

At least a portion of the pattern structure at an edge portion of the dummy region in the first and second directions may include a first conductive layer pattern, an insulation pattern and a second conductive layer pattern stacked sequentially.

At least one other example embodiment provides a method of manufacturing a variable resistance memory device, the method comprising: forming a plurality of first preliminary cell structures and a plurality of first preliminary dummy cell structures extending in a first direction on a first region of a substrate, each of the plurality of first preliminary cell structures and each of the plurality of first preliminary dummy cell structures including a first conductive layer pattern, a first preliminary switching element pattern and a first preliminary variable resistance layer pattern stacked sequentially, each of the plurality of first preliminary cell structures having a first width, and each of the plurality of first preliminary dummy cell structures having a second width, the second width being greater than the first width; selectively etching portions of the plurality of first preliminary cell structures and the plurality of first preliminary dummy cell structures at edge portions of the first region to expose the first conductive layer patterns; forming a plurality of second conductive layer patterns on the plurality of first preliminary cell structures, the plurality of second conductive layer patterns extending in a second direction crossing the first direction, each of the plurality of second conductive layer patterns having a third width; forming a plurality of second dummy conductive layer patterns on the plurality of first preliminary dummy cell structures, the plurality of second dummy conductive layer patterns extending in the second direction, and each of the plurality of second dummy conductive layer patterns having a fourth width, the fourth width being greater than the third width; and selectively etching the first preliminary variable resistance layer patterns and the first preliminary switching element patterns between the plurality of second conductive layer patterns and the plurality of second dummy conductive layer patterns to form a plurality of lower memory cells and a plurality of lower dummy pattern structures, each of the plurality of lower memory cells and the plurality of lower dummy pattern structures including the first conductive layer pattern, a lower variable resistance layer pattern, a lower switching element pattern and the second conductive layer pattern stacked sequentially.

The plurality of first preliminary dummy cell structures may be formed at edge portions of the first region in the second direction.

The plurality of second dummy conductive layer patterns may be formed at edge portions of the first region in the first direction.

The selectively etching the portions of the plurality of first preliminary cell structures and the plurality of first preliminary dummy cell structures at edge portions of the first region may include: removing etch residue on sidewalls of the plurality of first preliminary cell structures and the plurality of first preliminary dummy cell structures.

The method may further include: forming a plurality of upper memory cells and a plurality of upper dummy pattern structures corresponding to the plurality of lower memory cells and the plurality of lower dummy pattern structures; wherein each of the plurality of upper memory cells and each of the plurality of upper dummy pattern structures includes an upper switching element pattern, an upper variable resistance layer pattern and a third conductive layer pattern extending in the first direction.

The third conductive layer patterns may overlap the first conductive layer patterns.

The forming the plurality of upper memory cells and the plurality of upper dummy pattern structures may include: forming a plurality of second preliminary cell structures and a plurality of second preliminary dummy pattern structures on the plurality of lower memory cells and the plurality of lower dummy pattern structures, the plurality of second preliminary cell structures and the plurality of second preliminary dummy pattern structures extending in the first direction, each of the plurality of second preliminary cell structures and each of the plurality of second preliminary dummy cell structures including a second preliminary switching element pattern and a second preliminary variable resistance layer pattern sequentially stacked, each of the plurality of second preliminary cell structures having the first width, and each of the plurality of second preliminary dummy pattern structures having the second width; selectively etching portions of the plurality of second preliminary cell structures and the plurality of second preliminary dummy cell structures at edge portions of the first region to expose the plurality of second conductive layer patterns; forming a plurality of third conductive layer patterns and a plurality of third dummy conductive layer patterns on the plurality of second preliminary cell structures and the plurality of second preliminary dummy cell structures, the plurality of third conductive layer patterns and the plurality of third dummy conductive layer patterns extending in the second direction, each of the plurality of third conductive layer patterns having the first width, and each of the plurality of third dummy conductive layer patterns having a fifth width, the fifth width being greater than the first width; and etching the second preliminary variable resistance layer pattern and the second preliminary switching element pattern between the plurality of third conductive layer patterns and the plurality of third dummy conductive layer patterns to form the plurality of upper memory cells and the plurality of upper dummy pattern structures.

The selectively etching the portions of the plurality of second preliminary cell structures and the plurality of second preliminary dummy cell structures at edge portions of the first region may include: removing etch residue from sidewalls of the plurality of second preliminary cell structures and the plurality of second preliminary dummy cell structures.

The method may further include: forming a dishing prevention blocking pattern on a region surrounding a pattern structure including the plurality of lower memory cells and the plurality of lower dummy pattern structures.

At least one other example embodiment provides a resistive memory device, comprising: a memory cell pattern structure on a first region of a substrate; a first dummy cell pattern structure on the first region of the substrate, the first dummy cell pattern structure being adjacent to the memory cell pattern structure at an edge portion of the first region of the substrate; and a blocking pattern at an edge portion of the substrate, the blocking pattern being spaced apart from the first dummy cell pattern structure; wherein among the memory cell pattern structure, the first dummy cell pattern structure, and the blocking pattern, a conductive etch residue is on sidewalls of only the blocking pattern.

A width of at least a portion of the first dummy cell pattern structure may be different from a width of the memory cell pattern structure.

The memory cell pattern structure may include: a first conductive layer pattern on the first region of the substrate, the first conductive layer pattern extending in a first direction; and a memory cell conductive layer pattern on the first conductive layer pattern, the memory cell conductive layer pattern crossing the first conductive layer pattern and extending in a second direction. The first dummy cell pattern structure may include: the first conductive pattern on the first region of the substrate; and a first dummy cell conductive layer pattern on the first conductive layer pattern, the first dummy cell conductive layer pattern crossing the first conductive layer pattern and extending in the second direction. A width of the first dummy cell conductive layer pattern in the first direction may be different from a width of the memory cell conductive layer pattern in the first direction.

The width of the first dummy cell conductive layer pattern in the first direction may be greater than the width of the memory cell conductive layer pattern in the first direction.

The memory cell pattern structure may further includes: a memory cell structure between the first conductive layer pattern and the memory cell conductive layer pattern, the memory cell structure including a memory cell switching element and a memory cell variable resistance element, and the memory cell structure being at an intersection of the first conductive layer pattern and the memory cell conductive layer pattern. The first dummy cell pattern structure may further include: a first dummy cell structure between the first conductive layer pattern and the first dummy cell conductive layer pattern, the first dummy cell structure including a first dummy cell switching element and a first dummy cell variable resistance element, and the first dummy cell structure being at an intersection of the first conductive layer pattern and the first dummy cell conductive layer pattern. A width of the first dummy cell structure in the first direction may be different from a width of the memory cell structure in the first direction.

The width of the first dummy cell structure in the first direction may be greater than the width of the memory cell structure in the first direction.

The resistive memory device may further include: a second dummy cell pattern structure on the substrate. The second dummy cell pattern structure may include: the first conductive layer pattern; a second dummy cell conductive layer pattern; and a second dummy cell structure between the first conductive layer pattern and the second dummy cell conductive layer pattern, the second dummy cell structure including a second dummy cell switching element and a second dummy cell variable resistance element, and the second dummy cell structure being at an intersection of the first conductive layer pattern and the second dummy cell conductive layer pattern. A width of the second dummy cell structure in the second direction may be different from a width of the memory cell structure in the second direction.

The width of the second dummy cell structure in the second direction may be greater than the width of the memory cell structure in the second direction.

According to example embodiments, the variable resistance memory device may not include etch residues on the sidewalls of the pattern structure. Thus, leakage currents of the variable resistance memory device may decrease. Accordingly, the variable resistance memory device may have good electrical characteristics.

BRIEF DESCRIPTION OF THE DRAWINGS

Example embodiments will be more clearly understood from the following detailed description taken in conjunction with the accompanying drawings. FIGS. 1A to 36 represent some non-limiting, example embodiments as described herein.

FIGS. 1A and 1B are a cross-sectional view and a plan view, respectively, illustrating a variable resistance memory device in accordance with one or more example embodiments;

FIGS. 2 to 23 are cross-sectional views and plan views of stages of a method of manufacturing a variable resistance memory device in accordance with one or more example embodiments;

FIGS. 24 and 25 are cross-sectional views illustrating stages of a method of manufacturing a variable resistance memory device in accordance with one or more example embodiments;

FIGS. 27 to 36 are cross-sectional views illustrating stages of a method of manufacturing a variable resistance memory device in accordance with one or more example embodiments.

DETAILED DESCRIPTION

Figure 1A:
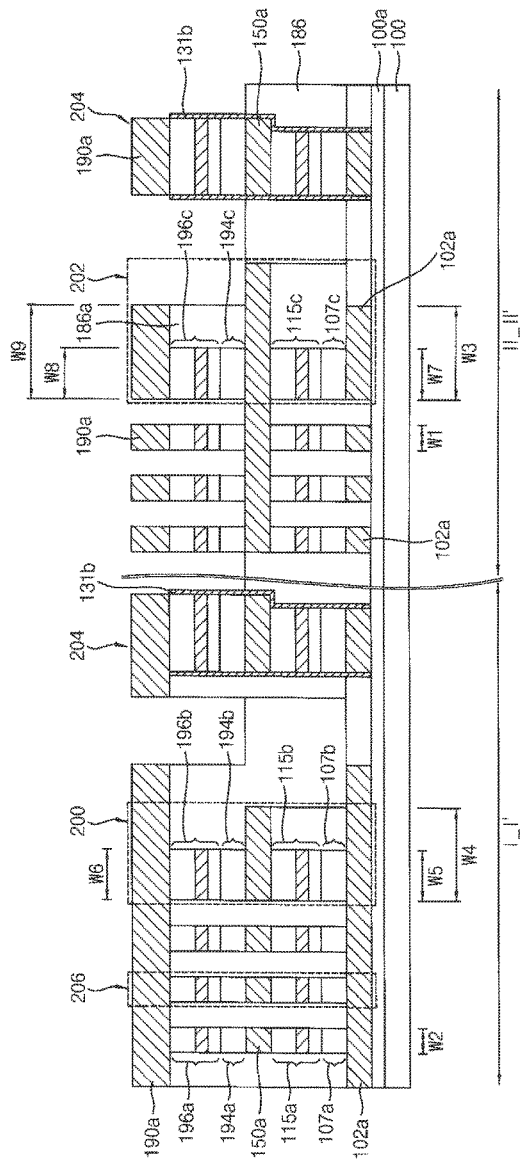

Various example embodiments will be described more fully hereinafter with reference to the accompanying drawings, in which some example embodiments are shown. The example embodiments may, however, be embodied in many different forms and should not be construed as limited to the example embodiments set forth herein. Rather, these example embodiments are provided so that this description will be thorough and complete, and will fully convey the scope of the example embodiments to those skilled in the art. In the drawings, the sizes and relative sizes of layers and regions may be exaggerated for clarity.

It will be understood that when an element or layer is referred to as being "on," "connected to" or "coupled to"

another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the example embodiments.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

Unless otherwise defined, all terms (including technical and scientific terms) used herein have the same meaning as commonly understood by one of ordinary skill in the art to which this example embodiment belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1B:
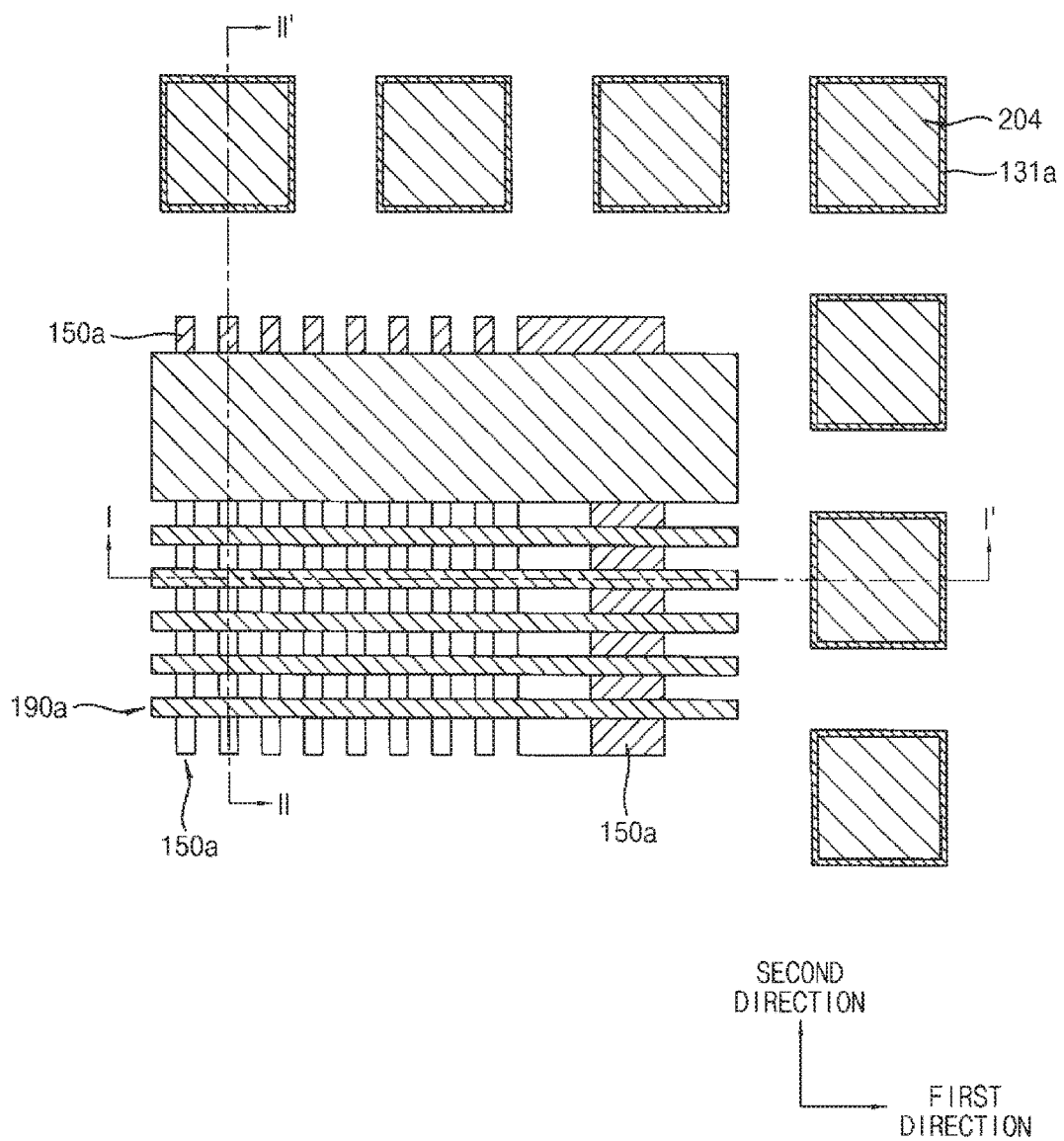

FIGS. 1A and 1B are a cross-sectional view and a plan view, respectively, illustrating a variable resistance memory device in accordance with one or more example embodiments. More particularly, FIG. 1A shows cross-sectional views of the variable resistance memory device taken along lines I-I' and II-II' in FIG. 1B, respectively.

Referring to FIGS. 1A and 1B, the variable resistance memory device may be formed on a substrate 100 including a first region and a second region. The first region may include a cell region and a dummy region, and the second region may include other regions of the substrate 100. An insulation layer 100a may be formed on the substrate 100. The insulation layer 100a may include an insulating material (e.g., silicon oxide, silicon nitride, silicon oxynitride, etc.). Alternatively, the substrate 100 may include an insulating material. In this example, the separate insulation layer 100a may be omitted.

A first memory cell 206 serving as an actual memory cell may be formed on the cell region. The dummy region may be positioned at an edge portion of the first region, and may be adjacent to the cell region. A first dummy pattern structure 200 and a second dummy pattern structure 202 may be formed on the dummy region. The first dummy pattern structure 200 and the second dummy pattern structure 202 may not serve as actual memory cells.

Hereinafter, the first memory cell 206 on the cell region will be described.

The first memory cell 206 may include a plurality of memory cells stacked in a third direction, which is perpendicular or substantially perpendicular to a top surface of the substrate 100. In one or more example embodiments, the first memory cell 206 may include a lower memory cell and an upper memory cell, which are stacked sequentially.

The lower memory cell may include a first conductive layer pattern 102a, a first switching element 107a, a first variable resistance element 115a and a second conductive layer pattern 150a. The upper memory cell may include the second conductive layer pattern 150a, a second switching element 194a, a second variable resistance element 196a and a third conductive layer pattern 190a. The second conductive layer pattern 150a may serve as a common conductive line for the lower and upper memory cells.

The first conductive layer pattern 102a may extend in a first direction in parallel or substantially parallel with a top surface of the substrate 100. In one or more example embodiments, a plurality of first conductive layer patterns 102a may be arranged in a second direction, which is perpendicular or substantially perpendicular to the first direction. The first conductive layer pattern 102a may include a metal (e.g., tungsten (W), platinum (Pt), palladium (Pd), rhodium (Rh), ruthenium (Ru), iridium ((Ir), copper (Cu), aluminum (Al), titanium (Ti), tantalum (Ta), silver (Ag), gold (Au), zirconium (Zr), nickel (Ni), cobalt (Co), zinc (Zn), tin (Sn), indium tin oxide (no), etc., or a metal nitride thereof). In at least some example embodiments, the first conductive layer pattern 102 may serve as a bit line or a word line of the lower memory cell.

The second conductive layer pattern 150a may be formed over the first conductive layer pattern 102a to be spaced apart from the first conductive layer pattern 102a. The second conductive layer pattern 150a may extend in the second direction. In at least some example embodiments, a plurality of second conductive layer patterns 150a may be arranged in the first direction. The second conductive layer pattern 150a may include a metal (e.g., tungsten, platinum, palladium, rhodium, ruthenium, iridium, copper, aluminum, titanium, tantalum, silver, gold, zirconium, nickel, cobalt, zinc, tin, indium tin oxide, etc., or a metal nitride thereof). In at least some example embodiments, the second conductive layer pattern 150a may serve as a common bit line or a common word line for the lower and upper memory cells. For example, when the first conductive layer pattern 102a serves as the bit line of the lower memory cell, the second conductive layer pattern 150a may serve as the common word line for the lower and upper memory cells.

A lower cell structure including the first switching element 107a and the first variable resistance element 115a may have a pillar shape. The lower cell structure may be formed between the first and second conductive layer patterns 102a and 150a in the third direction. The lower cell structure may be formed at an intersection at which the first and second conductive layer patterns 102a and 150a cross or overlap each other. The lower cell structure may serve as a unit memory cell. The lower cell structure may not protrude from sidewalls of the first and second conductive layer patterns 102a and 150a.

The first conductive layer pattern 102a of the lower memory cell may have a first width W1 in the second direction, and the second conductive layer pattern 150a of the lower memory cell may have a second width W2 in the first direction.

In at least some example embodiments, the first switching element 107a may include a diode. The first switching element 107a may include a lower conductive layer pattern (not shown) and a semiconductor pattern (not shown), which are stacked sequentially. The semiconductor pattern may be doped with n-type impurities and p-type impurities. In at least some example embodiments, the lower conductive layer pattern may not be formed in order to simplify the manufacturing process.

In at least some example embodiments, the first switching element 107a may include a material (e.g., an ovonic threshold switching (OTS) material including a chalcogenide glass, a transition metal oxide, or the like). In at least some example embodiments, the first switching element 107a may include a tunneling diode containing (e.g., titanium oxide, or the like). That is, for example, the first switching element 107a may include a material capable of controlling a current direction.

In at least some example embodiments, the first variable resistance element 115a may include a first electrode (not shown), a first variable resistance layer pattern (not shown) and a second electrode (not shown), which are stacked sequentially.

Each of the first and second electrodes may include a metal nitride (e.g., titanium nitride (TiNx), tungsten nitride (WNx), tantalum nitride (TaNx), zirconium nitride (ZrNx), etc.) or a metal silicon nitride (e.g., titanium silicon nitride (TiSiNx), tungsten silicon nitride (WSiNx), tantalum silicon nitride (TaSiNx), zirconium silicon nitride (ZrSiNx), etc.).

In at least some example embodiments, the variable resistance memory device may be a ReRAM, and thus, the first variable resistance layer pattern may include a material of which an electrical resistance may be changed due to oxygen vacancy or oxygen migration. In at least some example embodiments, the first variable resistance layer pattern 160a may include a perovskite-based material (e.g., STO ($SrTiO_3$), BTO ($BaTiO_3$), PCMO ($Pr_{1-x}Ca_xMnO_3$), etc. In at least some example embodiments, the first variable resistance layer pattern 160a may include a transition metal oxide (e.g., titanium oxide ($TiO_x$), zirconium oxide ($ZrO_x$), aluminum oxide ($AlO_x$), hafnium oxide ($HfO_x$), tantalum oxide ($TaO_x$), niobium oxide ($NbO_x$), cobalt oxide ($CoO_x$), tungsten oxide ($WO_x$), lanthanum oxide ($LaO_x$), zinc oxide ($ZnO_x$), etc.). These materials may be used alone or in combination. In at least some example embodiments, the first variable resistance layer pattern may include one or more layers including the materials discussed herein.

In at least one example embodiment, a variable resistance memory device may be a PRAM device, and thus, the variable resistance layer pattern may include a material of which a resistance may be changed as a result of changes or transitions in phase. In this case, the variable resistance layer pattern may be formed to include a chalcogenide-based material in which materials such as germanium (Ge), antimony (Sb) and/or tellurium (Te) are combined by a given ratio.

In at least some example embodiments, the variable resistance memory device may be an MRAM device, and thus the variable resistance layer pattern may include a material of which a resistance may be changed by a magnetic field or a spin transfer torque (STT). In this case, the variable resistance layer pattern may be formed to include a ferromagnetic material (e.g., iron (Fe), nickel (Ni), cobalt (Co), dysprosium (Dy), gadolinium (Gd), etc.).

In at least some example embodiments, the lower cell structure may include the first switching element 107a and the first variable resistance element 115a, which are stacked sequentially. Alternatively, the lower cell structure may include the first variable resistance element 115a and the first switching element 107a, which are stacked sequentially.

The third conductive layer pattern 190a may extend in the first direction. The third conductive layer pattern 190a may overlap the first conductive layer pattern 102a. Thus, the third conductive layer pattern 190a may have the first width W1 in the first direction. The third conductive layer pattern 190a may include a metal (e.g., tungsten, platinum, palladium, rhodium, ruthenium, iridium, copper, aluminum, titanium, tantalum, silver, gold, zirconium, nickel, cobalt, zinc, tin, indium tin oxide, etc., or a metal nitride thereof). In at least some example embodiments, the third conductive layer pattern 190a may serve as a bit line or a word line of the upper memory cell. For example, when the second conductive layer pattern 150a serves as the common word line for the lower and upper memory devices, the third conductive layer pattern 190a may serve as the bit line of the upper memory cell.

An upper cell structure including the second switching element 194a and the second variable resistance element 196a may have a pillar shape. The upper cell structure may be formed between the second and third conductive layer patterns 150a and 190a in the third direction. The upper cell structure may be formed at an intersection at which the second and third conductive layer patterns 150a and 190a cross or overlap each other. The upper cell structure may serve as a unit memory cell. The upper cell structure may not protrude from sidewalls of the second and third conductive layer patterns 150a and 190a. In at least some example embodiments, the upper cell structure may have a stacked layer structure, which is the same or substantially the same as a stacked layer structure of the lower cell structure.

In at least some example embodiments, the upper cell structure may include the second switching element 194a and the second variable resistance element 196a, which may be stacked sequentially. Alternatively, the upper cell structure may include the second variable resistance element 196a and the second switching element 194a, which may be stacked sequentially.

Hereinafter, the first and second dummy pattern structures 200 and 202 on the dummy region will be described. The first dummy pattern structure 200 may be formed on both edge portions in the first direction of the first region, and the second dummy pattern structure 202 may be formed on both edge portions in the second direction of the first region. FIG. 1B shows the first and second dummy patterns 200 and 202 on one edge portion of the first region for the convenience of explanation.

The first and second dummy pattern structures 200 and 202 may have materials that are the same or substantially the same as materials of the first memory cell. That is, for example, the first dummy pattern structure 200 may include the first conductive layer pattern 102a, a third switching element 107b, a third variable resistance element 115b, the second conductive layer pattern 150a, a fourth switching element 194b, a fourth variable resistance layer element 196b and the third conductive layer pattern 190a, which are stacked sequentially. The second dummy pattern structure 202 may include the first conductive layer pattern 102a, a fifth switching element 107c, a fifth variable resistance element 115c, the second conductive layer pattern 150a, a sixth switching element 194c, a sixth variable resistance element 196c and the third conductive layer pattern 190a, which are stacked sequentially.

Hereinafter, the first dummy pattern structure 200 will be described in more detail.

The first conductive layer pattern 102a may extend in the first direction from the cell region to the dummy region, and thus the first conductive layer pattern 102a of the first dummy pattern structure 200 may be the same or substantially the same as the first conductive layer pattern 102a on the cell region.

The second conductive layer pattern 150a of the first dummy pattern structure 200 may extend in the second direction, and may have a fourth width W4 in the first direction greater than the second width W2 of the second conductive layer pattern 150a on the cell region. That is, for example, the second conductive layer pattern 150a of the first dummy pattern structure 200 may be different from the second conductive layer pattern 150a on the cell region.

The third switching element 107b and the third variable resistance element 115b may be formed at an intersection at which the first and second conductive layer patterns 102a and 150a cross or overlap each other, and may have a fifth width W5 in the first direction. The fifth width may be less than the fourth width W4. Also, the fifth width W5 may be greater than the second width W2.

The third conductive layer pattern 190a may overlap the first conductive layer pattern 102a. The third conductive layer pattern 190a may extend in the first direction from the cell region to the dummy region, and thus the third conductive layer pattern 190a of the first dummy pattern structure 200 may be the same or substantially the same as the third conductive layer pattern 190a on the cell region.

The fourth switching element 194b and the fourth variable resistance element 196b may be formed at an intersection at which the first and second conductive layer patterns 150a and 190a cross or overlap each other, and each of the fourth switching element 194b and the fourth variable resistance element 196b may have a sixth width W6 in the first direction. The sixth width W6 may be less than the fourth width W4. The sixth width W6 may be greater than the second width W2. In one or more example embodiments, the sixth width W6 may be the same or substantially the same as the fifth width W5.

Thus, the second conductive layer pattern 150a of the first dummy pattern structure 200 may protrude in the first direction from sidewalls of the third switching element 107b, the third variable resistance element 115b, the fourth switching element 194b and the fourth variable resistance element 196b.

The patterns included in the first dummy gate structure 200 may correspond to the patterns included in the first memory cell 206, respectively. Each of the patterns included in the first dummy gate structure 200 may have a width in the first direction, which is greater than a width in the first direction (e.g., the second width W2) of each of the corresponding patterns included in the first memory cell 206.

Each of the first to third conductive layer patterns 102a and 190a of the first dummy structure 200 may extend in the first direction to be longer than a sidewall of each of the third switching element 107b, the third variable resistance element 115b, the fourth switching element 194b and the fourth variable resistance element 196b.

Hereinafter, the second dummy pattern structure 202 will be described.

The first conductive layer pattern 102a of the second dummy pattern structure 202 may extend in the first direction, and may have a third width W3, which is greater than the first width W1 of the first conductive layer pattern 102a on the cell region. That is, the first conductive layer pattern 102a of the second first dummy pattern structure 202 may be different from the first conductive layer pattern 102a on the cell region.

The second conductive layer pattern 150a may extend in the second direction from the cell region to the dummy region, and thus the second conductive layer pattern 150a of the second dummy pattern structure 202 may be the same or substantially the same as the second conductive layer pattern 150a on the cell region.

The fifth switching element 107c and the fifth variable resistance element 115c may be formed at an intersection at which the first and second conductive layer patterns 102a and 150a cross or overlap each other, and may have a seventh width W7 in the second direction. The seventh width W7 may be less than the third width W3. The seventh width W7 may be greater than the first width W1.

The third conductive layer pattern 190a may overlap the first conductive layer pattern 102a. The third conductive layer pattern 190a of the second dummy pattern structure 202 may extend in the first direction, and may have a ninth width W9 in the second direction. In one or more example embodiments, the ninth width W9 may be the same or substantially the same as the third width W3.

The sixth switching element 194c and the sixth variable resistance element 196c may be formed at an intersection at which the second and third conductive layer patterns 150a and 190a cross or overlap each other, and may have an eighth width W8 in the second direction. The eighth width W8 may be less than the ninth width W9. The eighth width W8 may be greater than the first width W1. In one or more example embodiments, the eighth width W8 may be the same or substantially the same as the seventh width W7.

Thus, the first and third conductive layer patterns 102a and 150a of the second dummy pattern structure 202 may protrude in the second direction from sidewalls of the fifth switching element 107c, the fifth variable resistance element 115c, the sixth switching element 194c and the sixth variable resistance element 196c.

The patterns included in the second dummy gate structure 202 may correspond to the patterns included in the first memory cells 200, respectively. Each of the patterns included in the second dummy gate structure 202 may have a width in the second direction that is greater than a width of each of the corresponding patterns included in the first memory cells 200.

The second conductive layer pattern 150a of the second dummy structure 202 may extend in the second direction to be longer than sidewalls of each of the fifth switching element 107c, the fifth variable resistance element 115c, the sixth switching element 194c and the sixth variable resistance element 196c.

According to at least some example embodiments, conductive etch residues may not be formed at sidewalls of the first memory cell 206 and the first and second dummy pattern structures 200 and 202 on the first region. Thus, leakage currents due to the conductive etch residues may decrease.

Peripheral circuits (not shown) and a blocking pattern 204 may be formed on the second region of the substrate 100.

During a chemical mechanical polishing (CMP) process, the blocking pattern 204 may suppress and/or prevent the patterns from dishing due to the density difference thereof. The blocking pattern 204 may have a pillar shape. A plurality of blocking patterns 204 may be spaced apart from each other, and may be formed to surround the first region. The blocking pattern 204 may have materials that are the same or substantially the same as materials of the first memory cell 206. Etch residues may be formed on sidewalls of the blocking pattern 204, however, the etch residues on the sidewalls of the blocking pattern 204 may not affect the electrical characteristics of the first memory cells 206.

FIGS. 2 to 23 are cross-sectional views and plan views illustrating a method of manufacturing a variable resistance memory device in accordance with example one or more embodiments. More particularly, each of the cross-sectional views includes cross-sections taken along lines I-I' and II-II', respectively, of a corresponding plan view.

Figure 2:
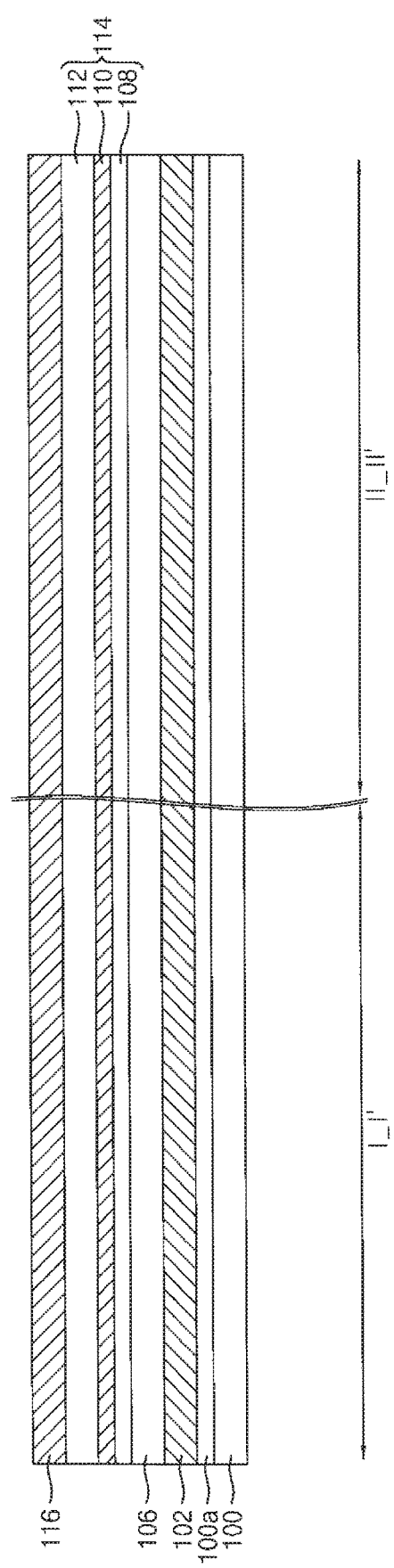
Figure 3:
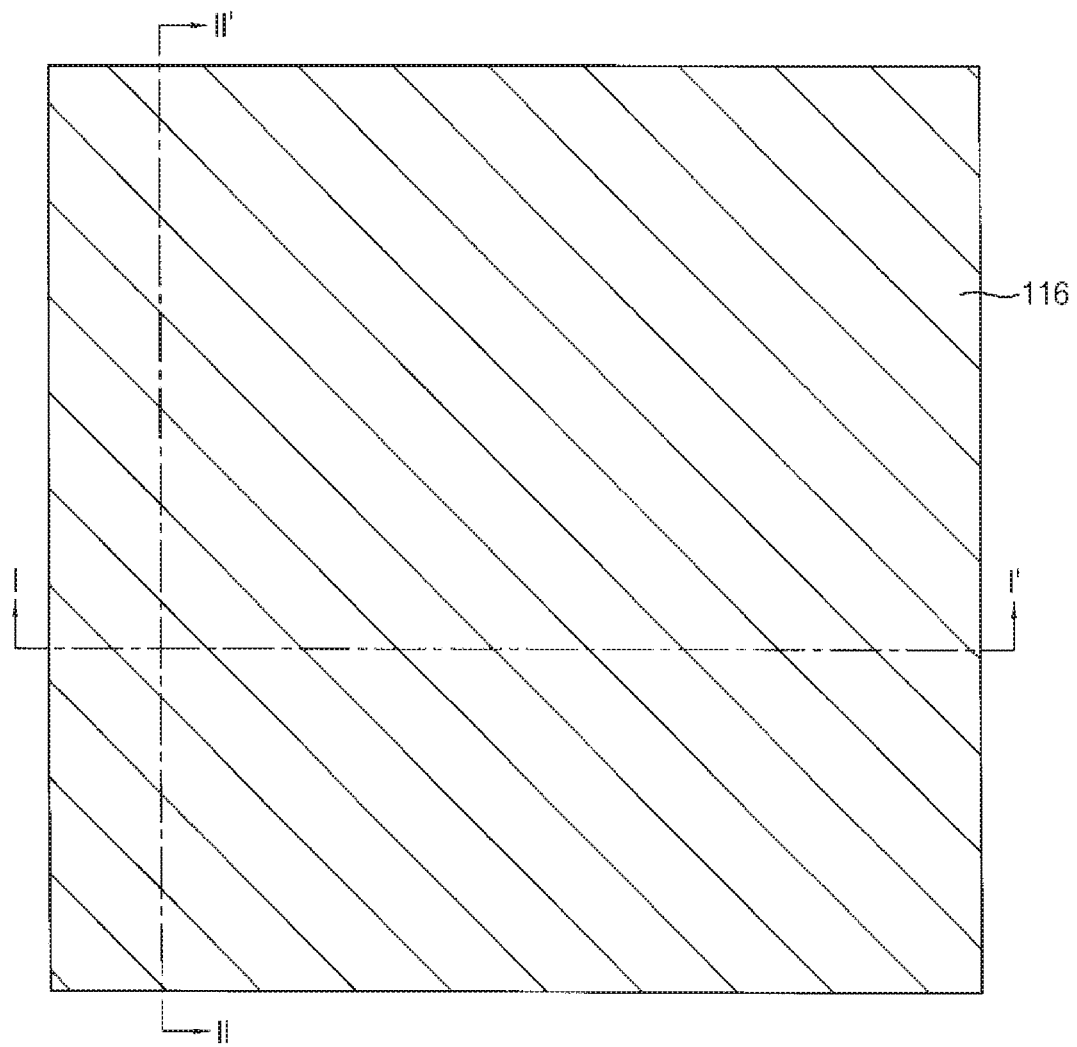

Referring to FIGS. 2 and 3, an insulation layer 100a may be formed on a substrate 100. In one or more example embodiments, when the substrate 100 includes an insulating material, the insulation layer 100a may not be formed on the substrate 100. A first conductive layer 102, a lower conductive layer (not shown), a first semiconductor layer 106, a first preliminary variable resistance structure 114 and a first hard mask layer 116 may be sequentially formed on the insulation layer 100a by, for example, a physical vapor deposition (PVD) process, an atomic layer deposition (ALD) process, a chemical vapor deposition (CVD) process, etc.

The insulation layer 100a may be formed to include an insulating material, such as silicon oxide, silicon nitride, silicon oxynitride, etc.

The first conductive layer 102 may be formed to include a metal, such as tungsten, platinum, palladium, rhodium, ruthenium, iridium, copper, aluminum, titanium, tantalum, etc., or a metal nitride thereof. In one or more example embodiments, the first conductive layer 102 may be formed to include a titanium nitride layer (not shown) and a tungsten layer (not shown) that are stacked sequentially.

The lower conductive layer may be formed to include a metal nitride or a metal silicon nitride, such as titanium nitride, titanium silicon nitride, tungsten nitride, tungsten silicon nitride, tantalum nitride, tantalum silicon nitride, zirconium nitride, zirconium silicon nitride, etc. In one or more example embodiments, the lower conductive layer may not be formed.

The first semiconductor layer 106 may serve as a switching element (e.g., a diode or the like). Lower and upper portions of the first semiconductor layer 106 may be doped with p-type impurities and n-type impurities, respectively.

The first preliminary variable resistance structure 114 may be formed to include a first electrode layer 108, a first variable resistance layer 110 and a second electrode layer 112, which are stacked sequentially. Each of the first and second electrode layers 108 and 112 may be formed to include a metal nitride or a metal silicon nitride, such as titanium nitride, titanium silicon nitride, tungsten nitride, tungsten silicon nitride, tantalum nitride, tantalum silicon nitride, zirconium nitride, zirconium silicon nitride, etc. In one example, the first and second electrode layers 108 and 112 may be formed to include titanium nitride.

The first variable resistance layer 110 may be formed to include a material of which an electrical resistance may be changed due to oxygen vacancy or oxygen migration. In at least one example embodiment, the first variable resistance layer 110 may include a perovskite-based material (e.g., STO ($SrTiO_3$), BTO ($BaTiO_3$), PCMO ($Pr_{1-x}Ca_xMnO_3$), etc.) In one or more example embodiments, the first variable resistance layer pattern 160a may include a transition metal oxide (e.g., titanium oxide ($TiO_x$), zirconium oxide ($ZrO_x$), aluminum oxide ($AlO_x$), hafnium oxide ($HfO_x$), tantalum oxide ($TaO_x$), niobium oxide ($NbO_x$), cobalt oxide ($CoO_x$), tungsten oxide (WOO, lanthanum oxide ($LaO_x$), zinc oxide ($ZnO_x$), etc.). These may be used alone or in a combination thereof. In one or more example embodiments, the first variable resistance layer 110 may be formed to include one layer or a plurality of layers including the materials.

In one or more example embodiments, the first variable resistance layer 110 may be formed to include a material of which a resistance may be changed by a change or transition in phase. For example, the first variable resistance layer 110 may be formed to include a chalcogenide-based material in which germanium, antimony and/or tellurium are combined by a given ratio. In at least one example embodiment, the first variable resistance layer 110 may be formed to include a material of which a resistance may be changed by a magnetic field or a spin transfer torque. For example, the first variable resistance layer 110 may be formed to include a ferromagnetic material (e.g., iron, nickel, cobalt, dysprosium, gadolinium, etc.).

The first hard mask layer 116 may be formed to include, for example, silicon nitride, silicon oxynitride, etc. For example, the first hard mask layer 116 may be formed to include a silicon oxide layer (not shown) and a silicon oxynitride layer (not shown), which are stacked sequentially.

Figure 4:
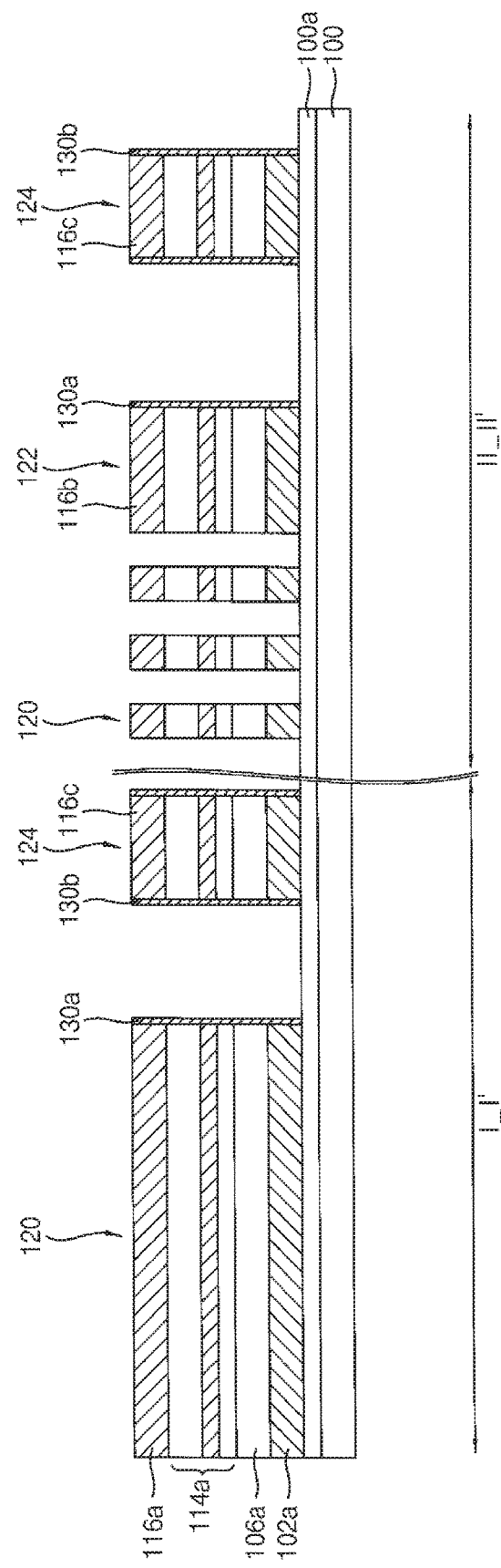
Figure 5:
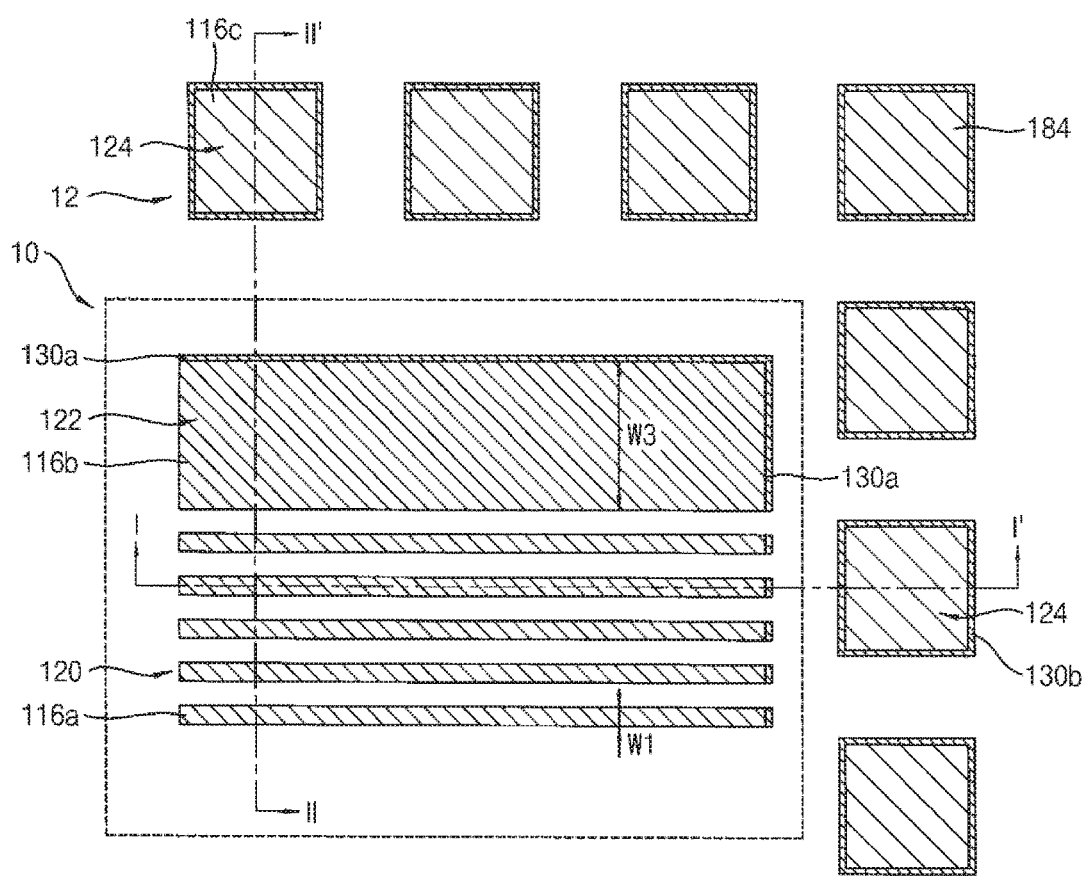

Referring to FIGS. 4 and 5, the first hard mask layer 116 may be etched to form a first hard mask 116a, a second hard mask 116b and a third hard mask 116c. The first preliminary variable resistance structure 114, the first semiconductor layer 106, the first lower conductive layer and the first conductive layer 102 may be etched using the first to third hard masks 116a, 116b and 116c as etching masks to form a first preliminary structure 120, a first preliminary dummy structure 122 and a first preliminary blocking pattern 124.

More particularly, for example, the first preliminary structure 120 may be formed on the first region using the first hard mask 116a as an etching mask, the first preliminary dummy structure 122 may be formed on the first region using the second hard mask 116b as an etching mask, and the first preliminary blocking pattern 124 may be formed on the second region using the third hard mask 116c as an etching mask.

Each of the first preliminary structure 120, first preliminary dummy structure 122 and the first preliminary blocking pattern 124 may include a first conductive layer pattern 102a, a first preliminary lower conductive layer pattern (not shown), a first preliminary semiconductor pattern 106a, a first preliminary variable resistance layer pattern 114a, and one of the hard mask patterns 116a, 116b and 116b, which are stacked sequentially.

Each of the first preliminary structure 120 and the first preliminary dummy structure 122 may be formed to extend in the first direction. In one or more example embodiments, the first preliminary structure 120 may be formed on the cell region and a portion of the dummy region, and the first preliminary dummy region 122 may be formed on both edge portions in the second direction of the dummy region.

The first preliminary dummy structure 122 may be formed to have a width in the second direction that is greater than a width in the second direction of the first preliminary structure. In one or more example embodiments, the first preliminary structure 120 may have a first width W1 in the second direction, and the first dummy preliminary structure 122 may have a third width W3 in the second direction. In one or more example embodiments, the first preliminary blocking pattern 124 may be formed to have a pillar shape.

When structures are formed by an etching process, the structures may have different etching characteristics from each other according to the density difference thereof, which may be referred as an etching loading effect. For example, a conductive etch residue may be formed on a sidewall of each of the first preliminary structure 120, the first preliminary dummy structure 122 and the first preliminary blocking pattern 124 on the dummy region and the second region. That is, for example, a first etch residue 130a may be formed on the sidewalls of the first preliminary structure 120 and first preliminary dummy structure 122 adjacent to the second region, and a second etch residue 130b may be formed on the sidewall of the first preliminary blocking pattern 124.

Figure 6:
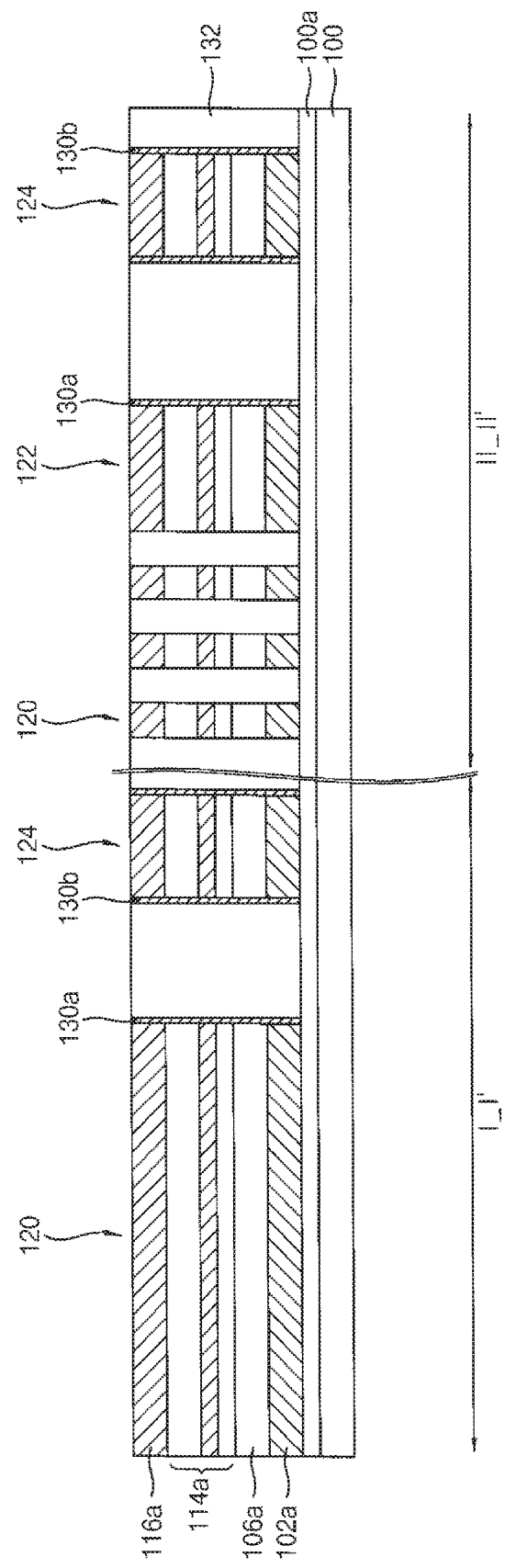

Referring to FIG. 6, a first insulating interlayer 132 may be formed on the first insulation layer 100a to cover the first preliminary structure 120, the first preliminary dummy structure 122 and the first preliminary blocking pattern 124. The first insulating interlayer 132 may be planarized until top surfaces of the first preliminary structure 120, the first preliminary dummy structure 122 and the first preliminary blocking pattern 124 may be exposed. The first insulating interlayer 132 may be formed to include, for example, silicon oxide, silicon nitride, etc. In one or more example embodiments, the planarization process may be performed by a CMP process and/or an etch back process. During the planarization process, a dishing phenomenon may decrease due to the first preliminary blocking pattern 124.

Figure 7:
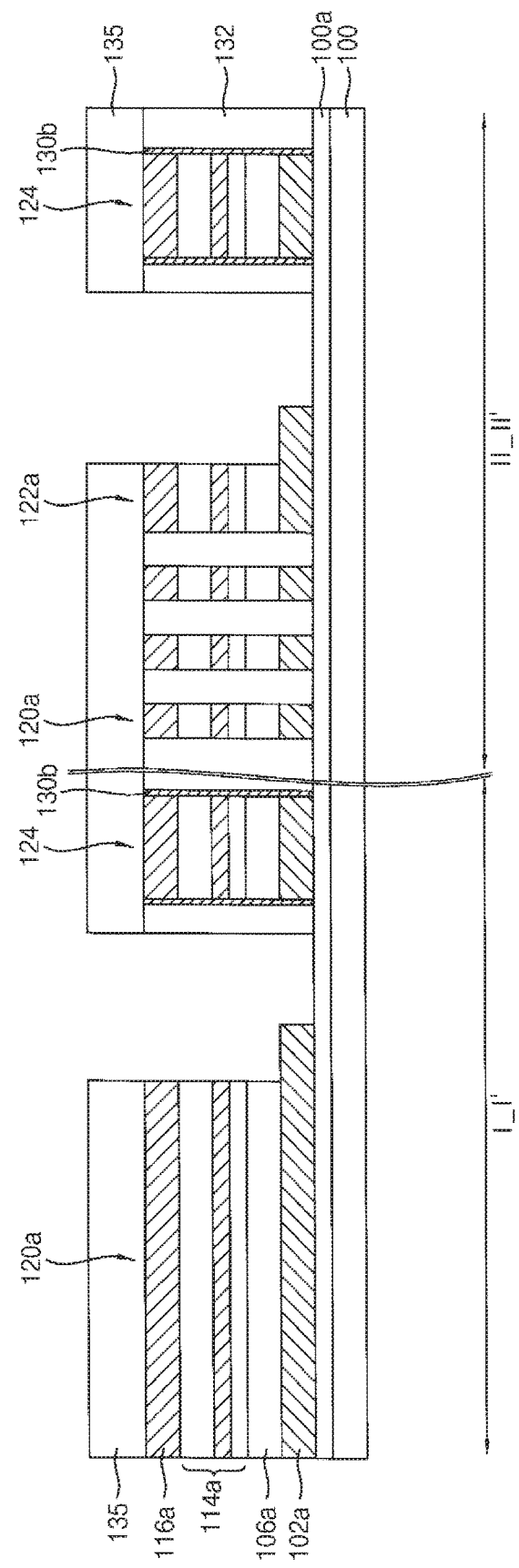
Figure 8:
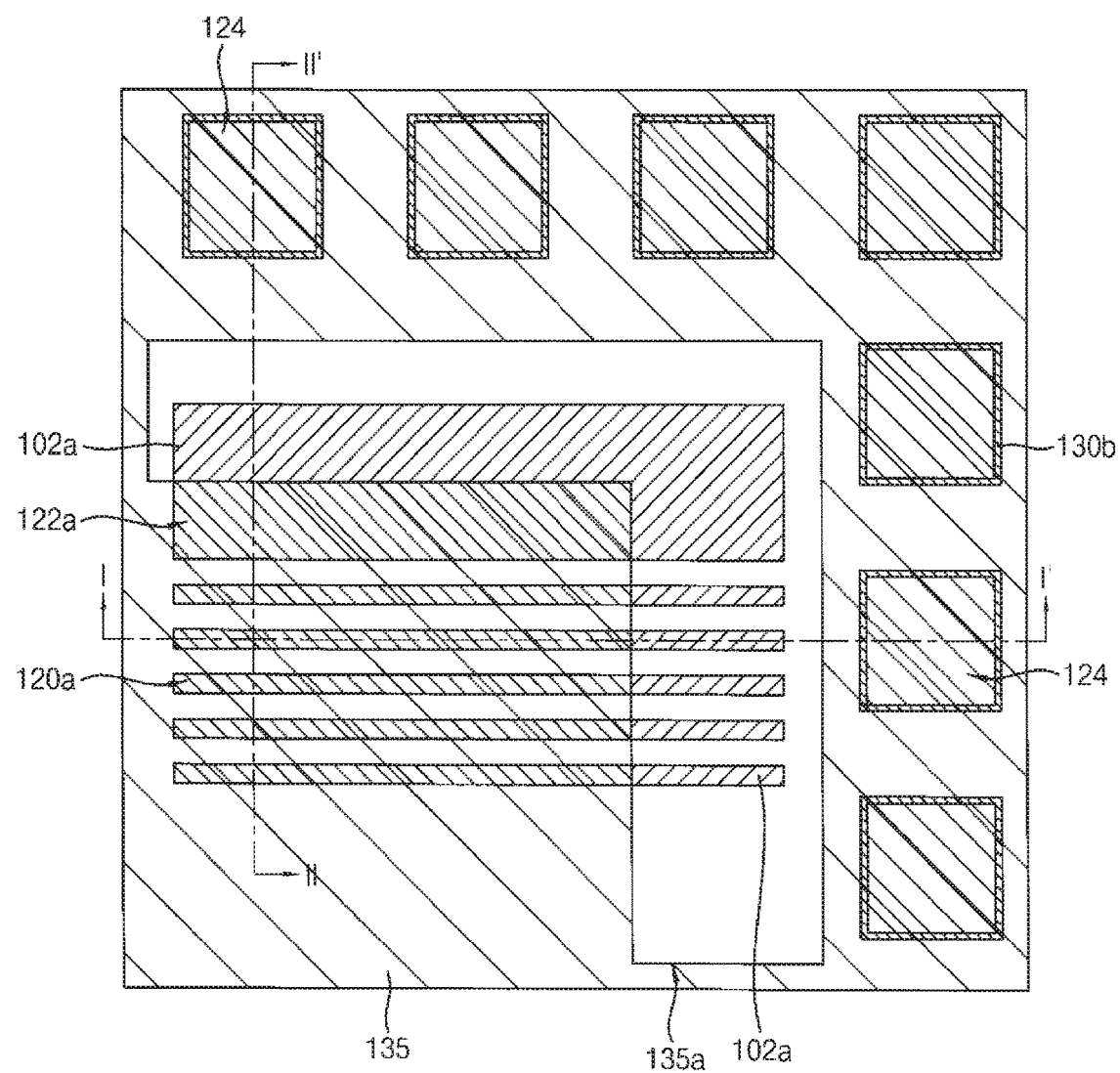

Referring to FIGS. 7 and 8, a first mask layer may be formed on the first preliminary structure 120, the first preliminary dummy structure 122, the first preliminary blocking pattern 124 and the first insulating interlayer 132. In one or more example embodiments, the first mask layer may be formed to include a photoresist film. The first mask layer may be patterned to form a first mask 135, which may cover (e.g., entirely cover) the cell region and may expose a portion of the dummy region. Also, the first mask 135 may cover the first preliminary blocking pattern 124 of the second region, and may expose a region for forming peripheral circuits.

In one or more example embodiments, sidewalls of the first preliminary structure 120 and the first preliminary dummy structure 122 on an edge portion of the first region may be selectively exposed by the first mask 135. That is, for example, the first etch residue 130a on the sidewalls of the first preliminary structure 120 and the first preliminary dummy structure 122 may be selectively exposed by the first mask 135.

The first preliminary dummy structure 120 and the first preliminary structure 120 may be anisotropically etched using the first mask 135 as an etching mask until a top surface of the first conductive layer pattern 102a may be exposed. During the etching process, the first etch residue 130a on the sidewalls of the first preliminary structure 120 and the first preliminary dummy structure 122 may be removed. In the etching process, the first conductive layer pattern 102a may serve as an etch stop layer.

By the etching process, a second preliminary structure 120a and a second preliminary dummy structure 122a may be formed on the first region. The first conductive layer pattern 102a of the second preliminary dummy structure 122a may protrude (e.g., relatively protrude) in the second direction.

The second preliminary structure 120a and the second preliminary dummy structure 122a may not include the first etch residue. However, the first preliminary blocking pattern 124 may not be etched by the etching process, so that the second etch residue 130b may remain on the sidewall of the first preliminary blocking pattern 124. However, the second etch residue 130b may not affect electrical characteristics of a memory cell.

Figure 9:
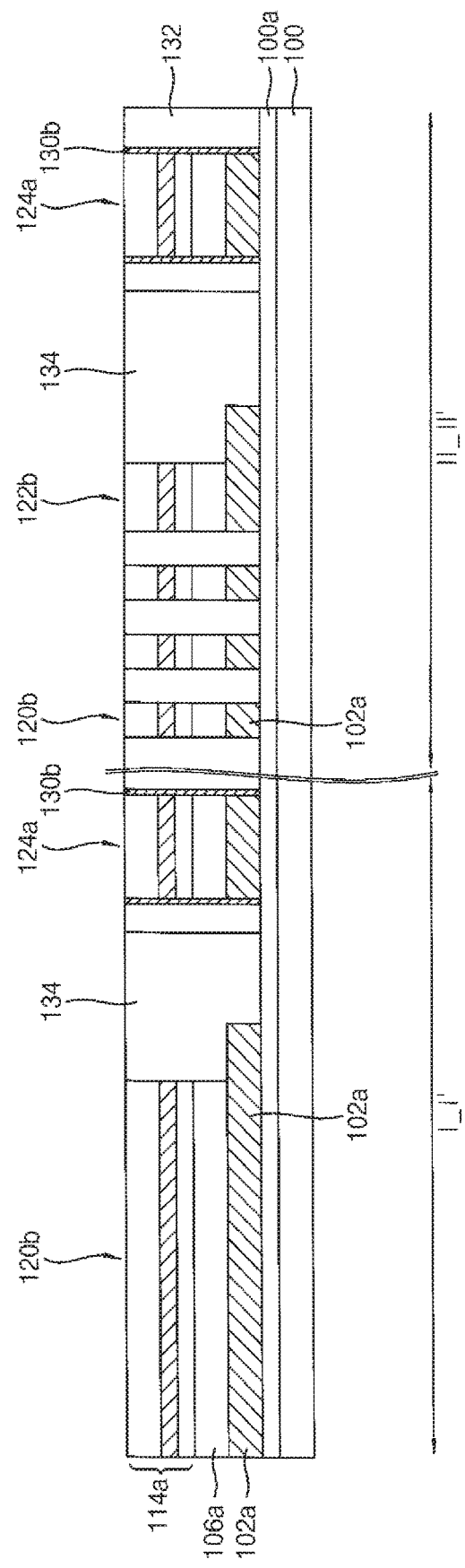
Figure 10:
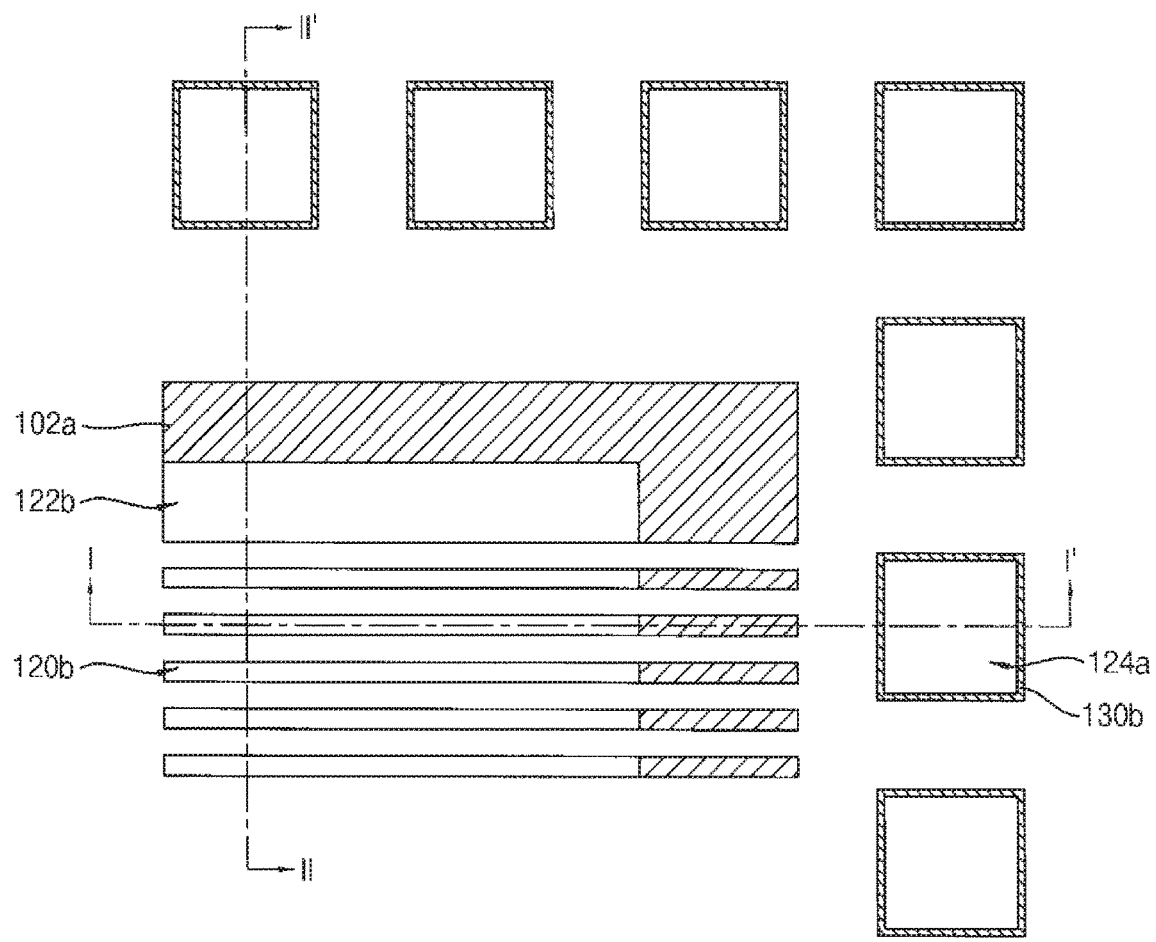

Referring to FIGS. 9 and 10, a second insulating interlayer 134 may be formed on the insulation layer 100a and the first insulating interlayer 132 to cover the second preliminary structure 120a, the second preliminary dummy structure 122a and the first preliminary blocking pattern 124.

The second insulating interlayer 134 may be planarized until the first to third hard masks 116a, 116b and 116c may be removed. In one or more example embodiments, portions of the first to third hard masks 116a, 116b and 116c may be removed after the planarization process. Thus, a third preliminary structure 120b, a third preliminary dummy structure 122b and a second preliminary blocking pattern 124a may be formed on the insulation layer 100a. The first preliminary variable resistance layer patterns 114a included in the third preliminary structure 120b, the third preliminary dummy structure 122b and the second preliminary blocking pattern 124a may be exposed.

The second insulating interlayer 134 may be formed to include, for example, silicon oxide, silicon nitride, etc. In one or more example embodiments, the planarization process may be performed by a CMP process and/or an etch back process. During the planarization process, a dishing phenomenon may decrease due to the second preliminary blocking pattern 124a.

Figure 11:
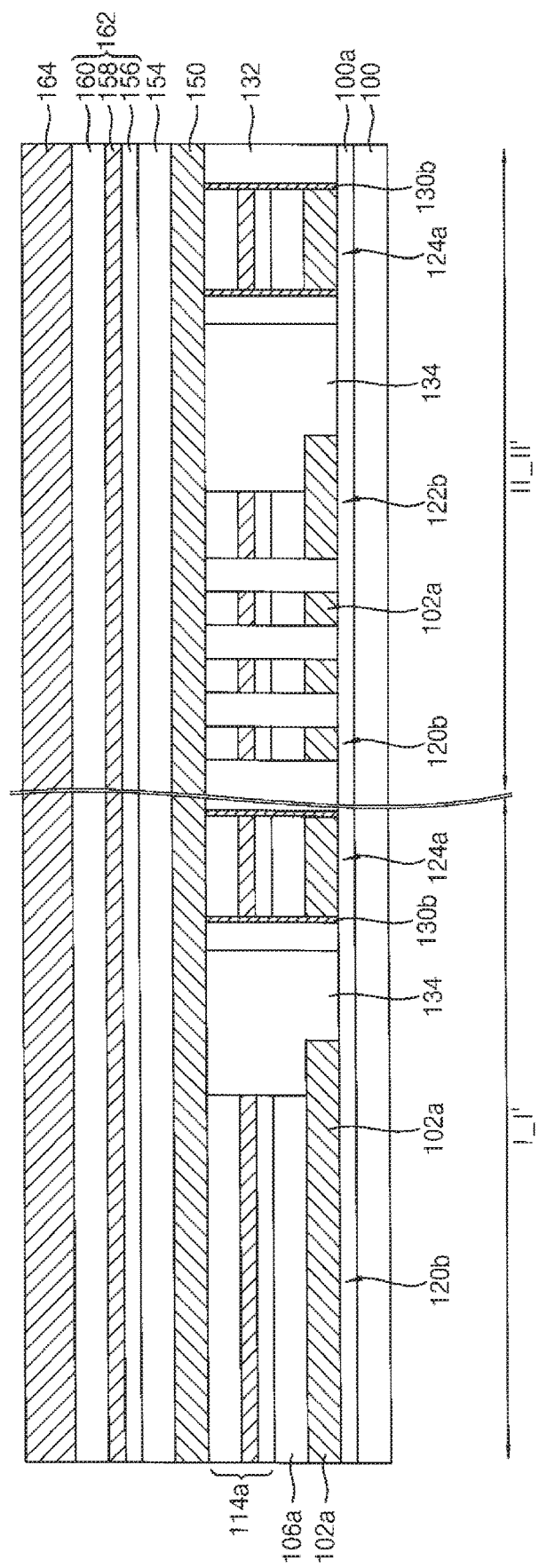
Figure 12:
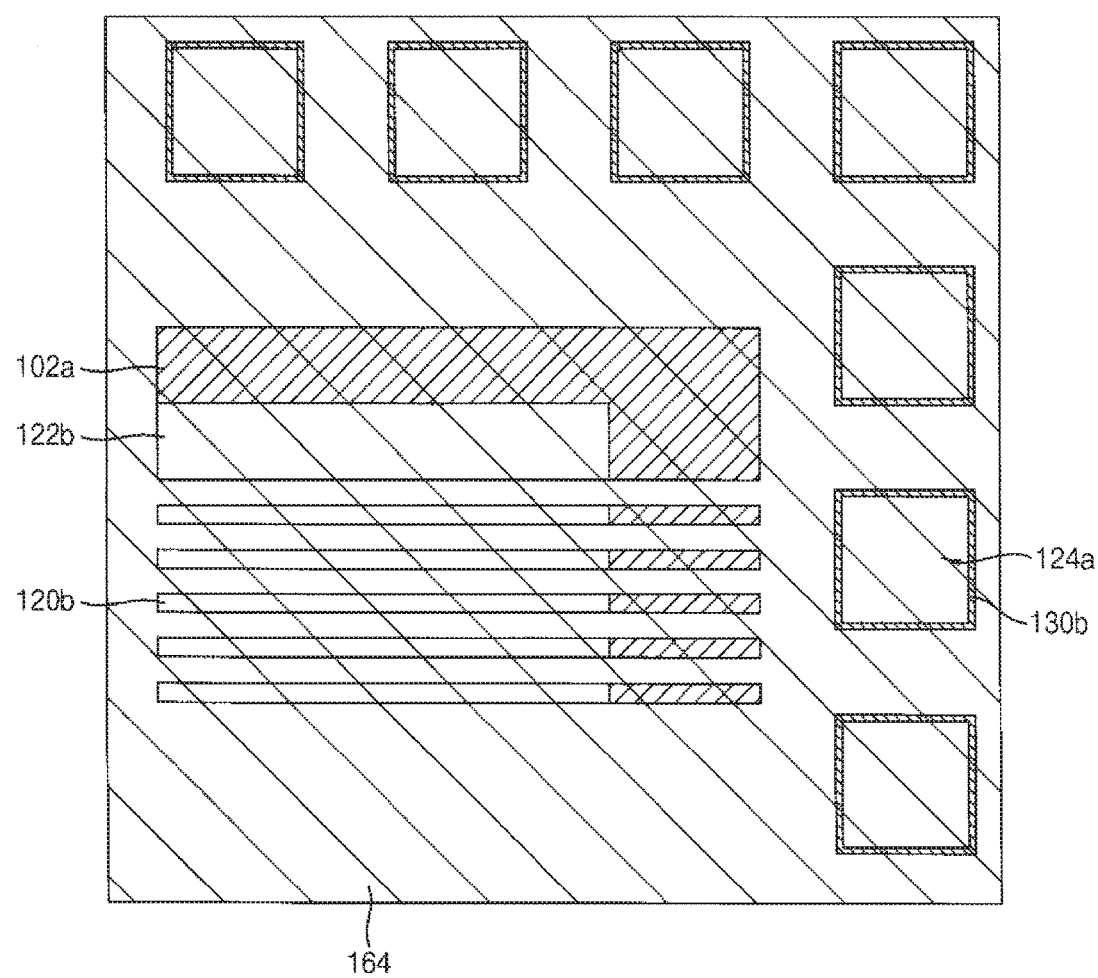

Referring to FIGS. 11 and 12, a second conductive layer 150, a second lower conductive layer (not shown), a second semiconductor layer 154, a second preliminary variable resistance structure 162 and a second hard mask layer 164 may be formed (e.g., sequentially formed) on the first preliminary variable resistance layer pattern 114a and the first and second insulating interlayers 132 and 134 by, for example, a PVD process, an ALD process, a CVD process, etc.

The second conductive layer 150 may be formed to include a metal, such as tungsten, platinum, palladium, rhodium, ruthenium, iridium, copper, aluminum, titanium, tantalum, etc., or a metal nitride thereof. For example, the second conductive layer 150 may be formed to include a titanium nitride layer (not shown) and a tungsten layer (not shown), which are stacked sequentially.

The second lower conductive layer may be formed to include a metal nitride or a metal silicon nitride, such as titanium nitride, titanium silicon nitride, tungsten nitride, tungsten silicon nitride, tantalum nitride, tantalum silicon nitride, zirconium nitride, zirconium silicon nitride, etc. In at least some example embodiments, the second lower conductive layer may not be formed.

The second semiconductor layer 154 may serve as a switching element, such as a diode or the like. Lower and upper portions of the second semiconductor layer 154 may be doped with p-type impurities and n-type impurities, respectively.

The second preliminary variable resistance structure 162 may be formed to include a third electrode layer 136, a second variable resistance layer 158 and a fourth electrode layer 160, which are stacked sequentially.

The second hard mask layer 164 may be formed to include, for example, silicon nitride, silicon oxynitride, etc.

The second conductive layer 150, the second lower conductive layer, the second semiconductor layer 154 and the second preliminary variable resistance structure 162 may subsequently form an upper memory cell. In one or more example embodiments, the upper memory cell may have a stacked layer structure that is the same or substantially the same as a stacked layer structure of a lower memory cell. Thus, the second lower conductive layer, the second semiconductor layer 154 and the second preliminary variable resistance structure 162 may have materials that are the same or substantially the same as materials of the first lower conductive layer, the first semiconductor layer 106 and the first preliminary variable resistance structure 114, respectively.

Figure 13:
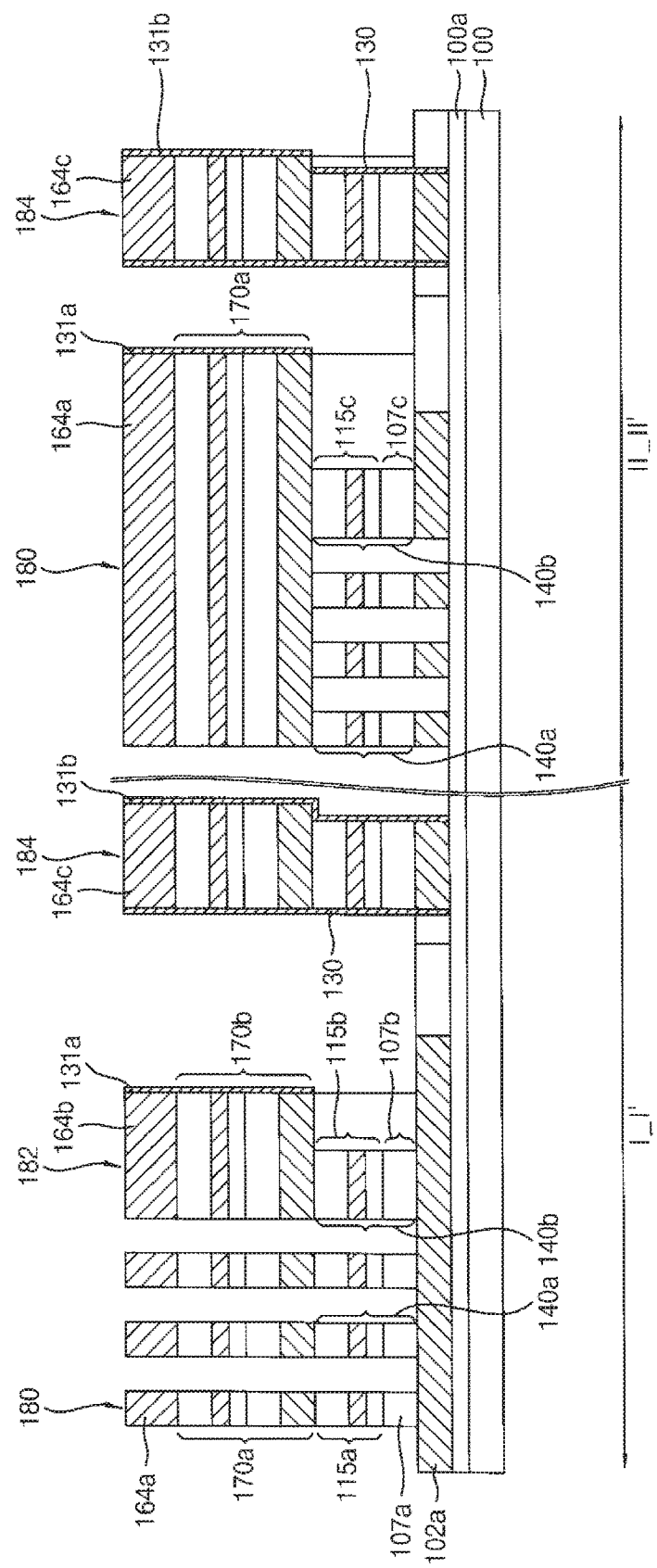
Figure 14:
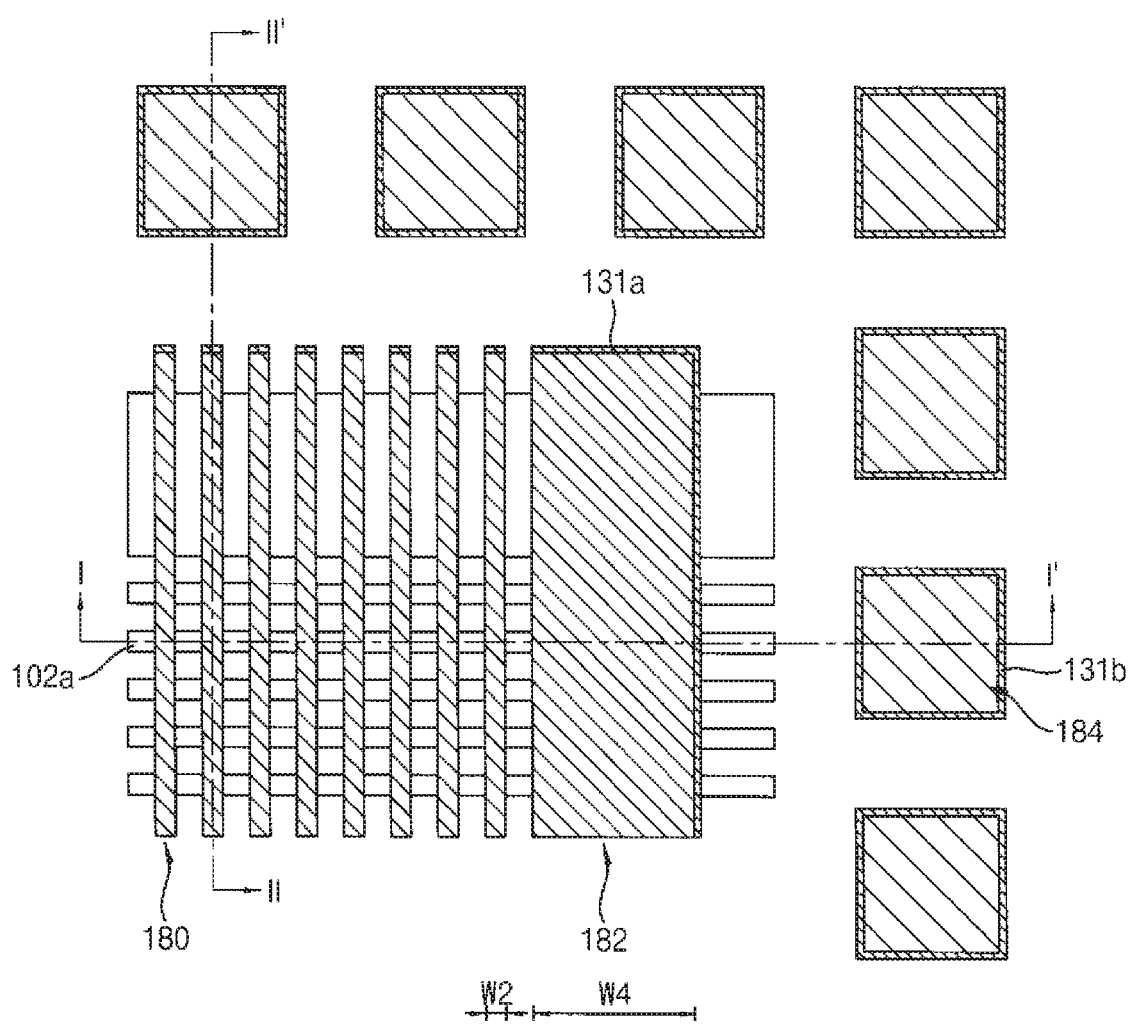

Referring to FIGS. 13 and 14, the second hard mask layer 164 may be etched to form a fourth hard mask 164a, a fifth hard mask 164b and a sixth hard mask 164c. The fourth and fifth hard masks 164a and 164b may be formed to extend in the second direction. The fifth hard mask 164b may be formed on both edge portions in the first direction of the first region, and the fourth hard mask 164a may be formed on other portions of the first region. The fifth hard mask 164b may be formed to have a width in the first direction that is greater than a width in the first direction of the fourth hard mask 164a. The sixth hard mask 164c may be formed to overlap the second preliminary blocking pattern 124a.

The second variable resistance structure 162, the second semiconductor layer 154, the second lower conductive layer, the second conductive layer 150, the first preliminary variable resistance pattern 114a, the first preliminary semiconductor pattern 106a, and the first preliminary lower conductive layer pattern may be etched (e.g., sequentially etched) using the fourth to sixth hard masks 164a, 164b and 164c as etching masks. In the etching process, the first conductive layer pattern 102a may serve as an etch stop layer.

That is, for example, a fourth preliminary structure 180 may be formed on the first region using the fourth hard mask 164a as an etching mask, a fourth preliminary dummy structure 182 may be formed on the first region using the fifth hard mask 164b as an etching mask, and a third preliminary blocking pattern 184 may be formed on the second region using the sixth hard mask 164c as an etching mask.

Each of the fourth preliminary structure 180 and the fourth preliminary dummy structure 182 may include one of the first upper structures 170a and 170b and one of the first lower structures 140a and 140b. Each of the first upper structures 170a and 170b may be formed by patterning the second variable resistance structure 162, the second semiconductor layer 154, the second lower conductive layer and the second conductive layer 150. Each of the first lower structures 140a and 140b may be formed by patterning the first preliminary variable resistance layer pattern 114a, the first preliminary semiconductor pattern 106a and the first lower conductive layer pattern. Each of the first upper structures 170a and 170b may extend in the second direction, and each of the first lower structure 140a and 140b may have a pillar shape.

The first lower structure 140a on the cell region may serve as a lower cell structure including the first switching element 107a and the first variable resistance element 115a. The first lower structure 140a on both edge portions in the second direction of the dummy region may serve as the third switching element 107b and the third variable resistance element 115b, and the first lower cell structure 140a on both edge portions in the first direction of the dummy region may serve as the fifth switching element 107c and the fifth variable resistance element 115c.

Also, the second conductive layer 150 may be etched to form a second conductive layer pattern 150a. In one or more example embodiments, the second conductive layer pattern 150a may serve as a common word line of the upper and lower memory cells. As described above, the lower memory cell may be formed.

The first upper structure 170b on both edge portions in the first direction of the dummy region may be formed to have a width in the first direction greater than a width in the first direction of the first upper structure 170a on the cell region. That is, for example, the first upper structure 170a on the cell region may have a second width W2 in the first direction, and the first upper structure 170b on both edge portions in the first direction of the dummy region may have a fourth width W4 in the first direction.

The first upper structure 170b on both edge portions in the second direction of the dummy region may protrude from sidewalls of the third switching element 107b and the third variable resistance element 115b included in the first lower structure 140b thereunder.

A third etch residue 131a may be formed on sidewalls of the fourth preliminary structure 180 and the fourth preliminary dummy structure 182 adjacent to the second region, and a fourth etch residue 131b may be formed on sidewall of the third preliminary blocking pattern 184.

Figure 15:
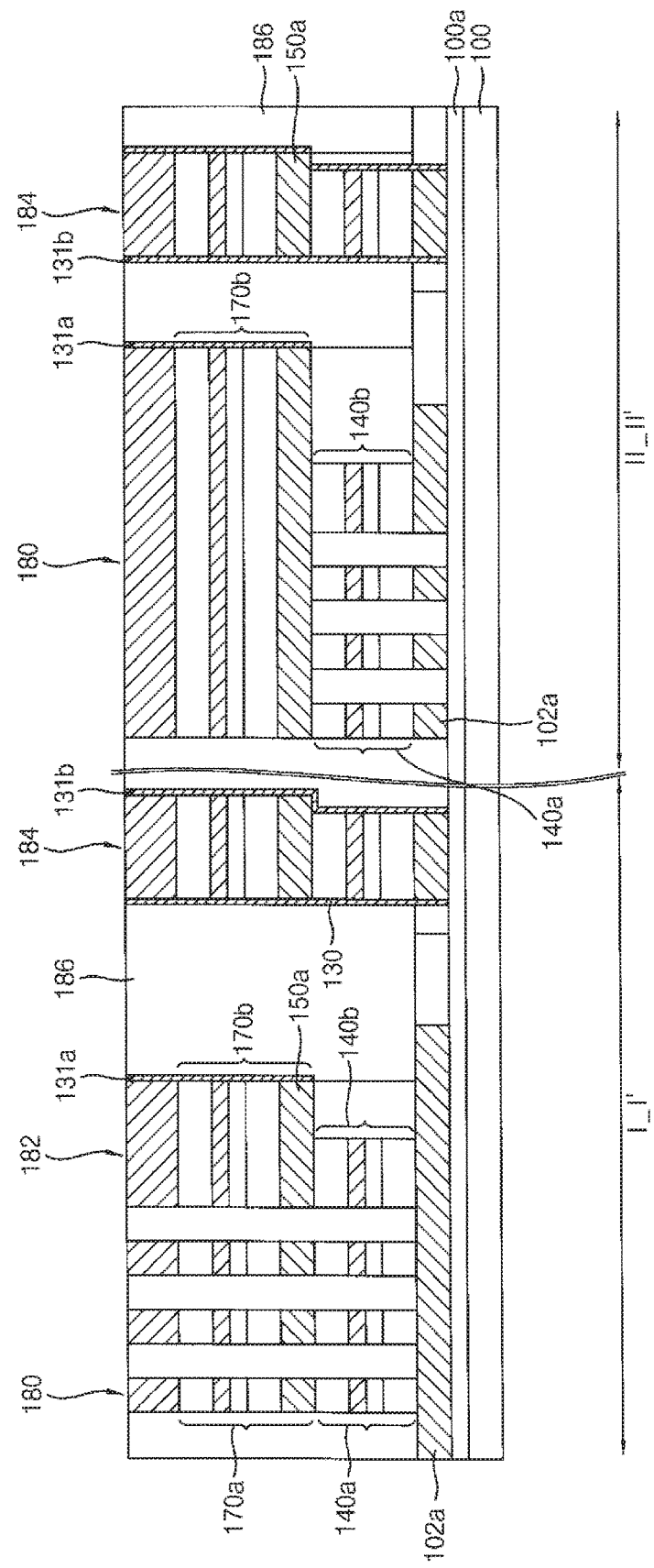

Referring to FIG. 15, a third insulating interlayer 186 may be formed to cover the fourth preliminary structure 180, the fourth preliminary dummy structure 182 and the third preliminary blocking pattern 184. The third insulating interlayer 186 may be planarized until top surfaces of the fourth preliminary structure 180, the fourth preliminary dummy structure 182 and the third preliminary blocking pattern 184 may be exposed. The third insulating interlayer 186 may be formed to include, for example, silicon oxide, silicon nitride, etc. In one or more example embodiments, the planarization process may be performed by a CMP process and/or an etch back process. During the planarization process, a dishing phenomenon may decrease due to the third preliminary blocking pattern 184.

Figure 16:
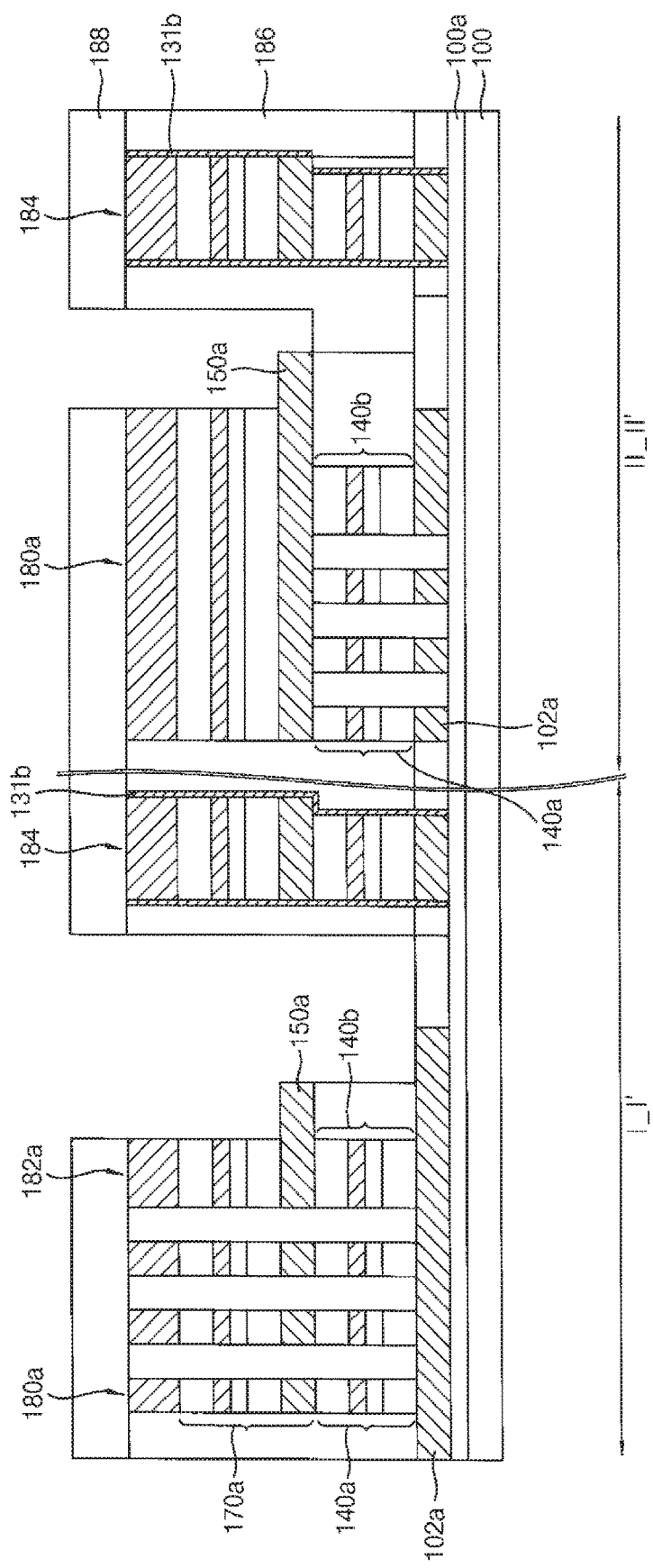
Figure 17:
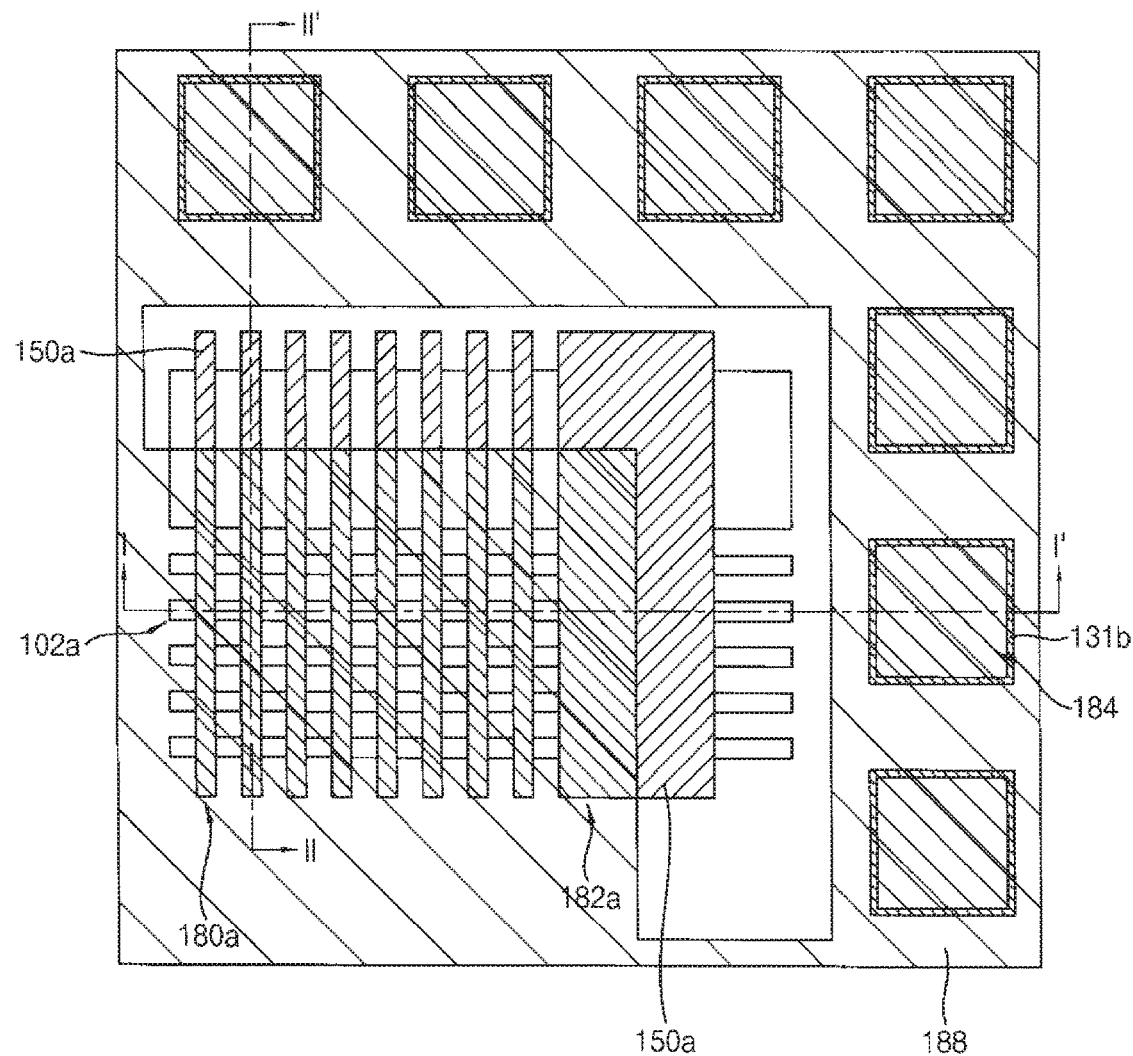

Referring to FIGS. 16 and 17, a second mask layer may be formed on the fourth preliminary structure 180, the fourth preliminary dummy structure 182, the third preliminary blocking pattern 184 and the third insulating interlayer 186. In one or more example embodiments, the second mask layer may be formed to include a photoresist film. The second mask layer may be patterned to form a second mask 188, which may cover (e.g., entirely cover) the cell region and may expose a portion of the dummy region.

In one or more example embodiments, the second mask 188 may have a shape that is the same or substantially the same as a shape of the first mask. Thus, the third etch residue 131a on the sidewalls of the fourth preliminary dummy structure 182 and the fourth preliminary structure 180 may be exposed by the second mask 188.

The fourth preliminary dummy structure 182 and the fourth preliminary structure 180 may be etched using the second mask as an etching mask until a top surface of the second conductive layer pattern 150a may be exposed. In the etching process, the second conductive layer pattern 150a may serve as an etch stop layer. During the etching process, the third etch residue 131a on the sidewalls of the fourth preliminary structure 180 and the fourth preliminary dummy structure 182 may be removed.

Thus, a fifth preliminary structure 180a may be formed on the cell region, and a fifth preliminary dummy structure 182a may be formed on the dummy region. The second conductive layer pattern 102a of the fifth preliminary dummy structure 182a may protrude (e.g., relatively protrude) in the first direction.

The fifth preliminary structure 180a and the fifth preliminary dummy structure 182a may not include the third etch residue. The fourth etch residue 131b may remain on the sidewall of the third preliminary blocking pattern 184, however, the fourth etch residue 131b may not affect the electrical characteristics of a memory cell.

Figure 18:
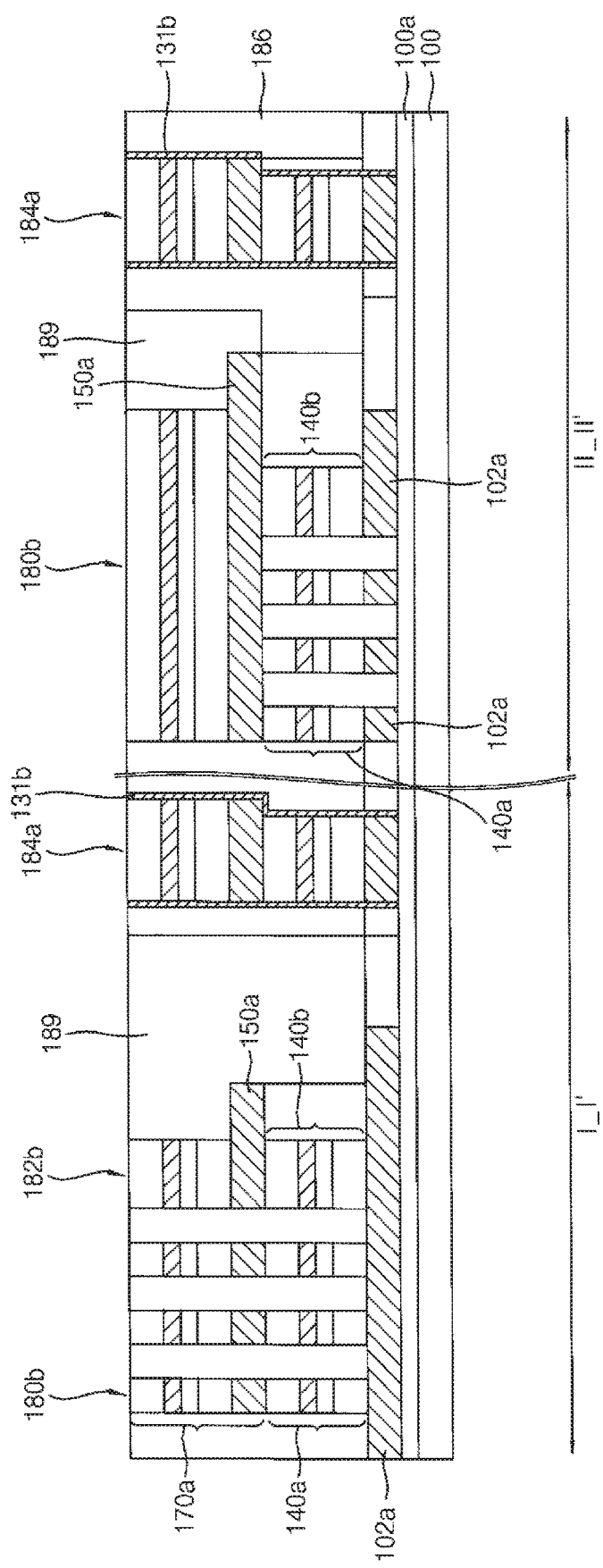
Figure 19:
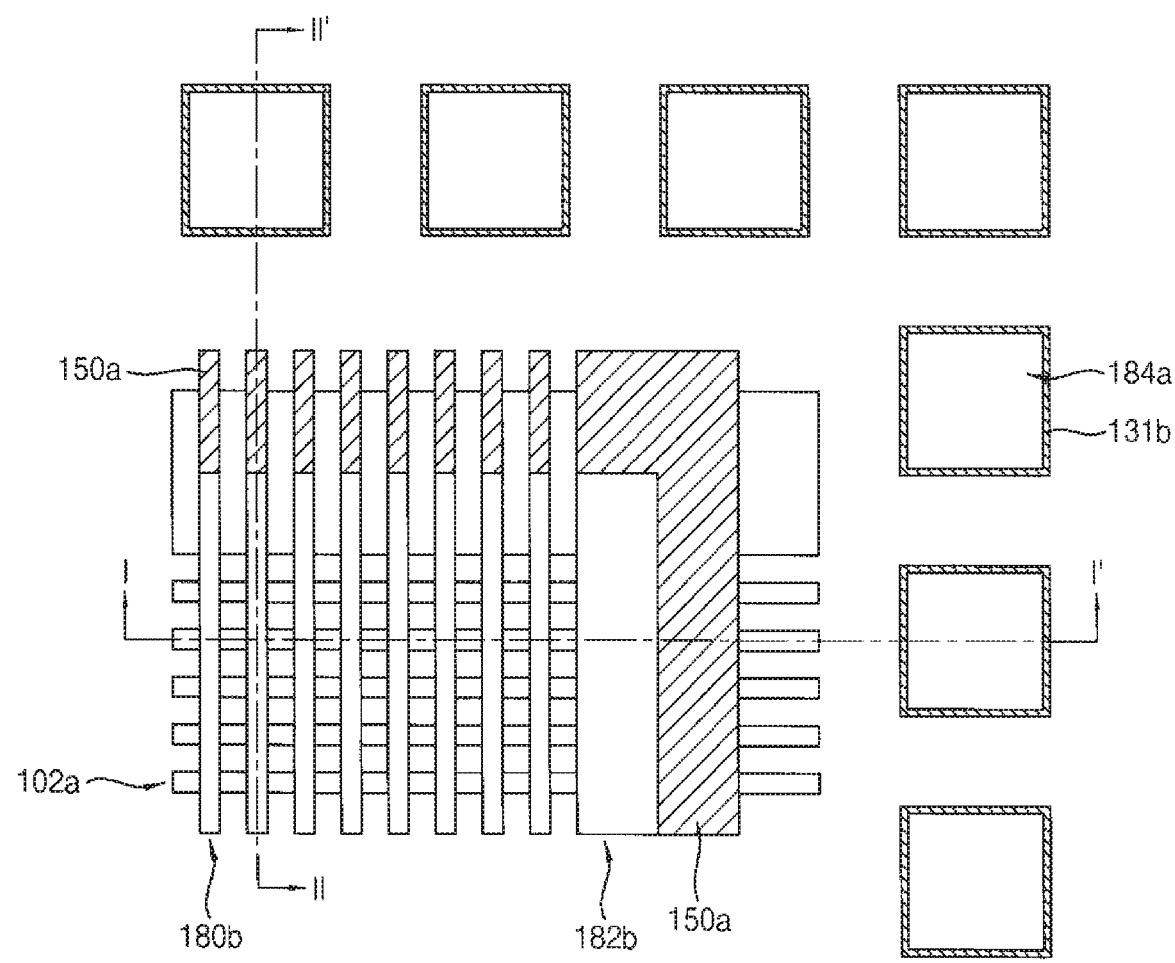

Referring to FIGS. 18 and 19, a fourth insulating interlayer 189 may be formed on the insulation layer 100a and the third insulating interlayer 186 to cover the fifth preliminary structure 180a, the fifth preliminary dummy structure 182a and the third preliminary blocking pattern 184. The fourth insulating interlayer 189 may be planarized until the fourth to sixth hard masks 164a, 164b and 164c may be removed. Thus, top surfaces of the first upper structures 170a and 170b may be exposed. In one or more example embodiments, portions of the fourth to sixth hard masks 164a, 164b and 164c may be removed after the planarization process. Thus, a sixth preliminary structure 180b, a sixth preliminary dummy structure 182b and a fourth preliminary blocking pattern 184a may be formed on the first conductive layer pattern 102a.

The fourth insulating interlayer 189 may be formed to include, for example, silicon oxide, silicon nitride, etc. In one or more example embodiments, the planarization process may be performed by a CMP process and/or an etch back process. During the planarization process, a dishing phenomenon may decrease due to the fourth preliminary blocking pattern 184a.

Figure 20:
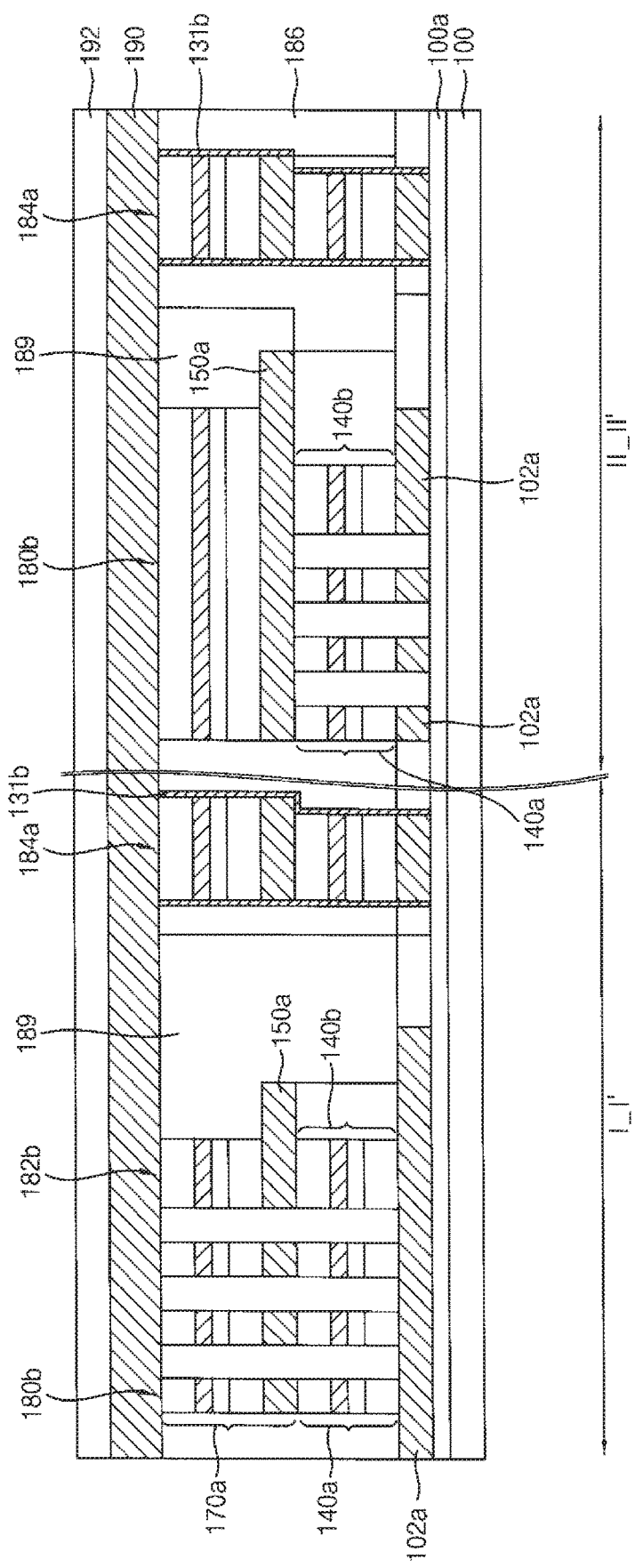
Figure 21:
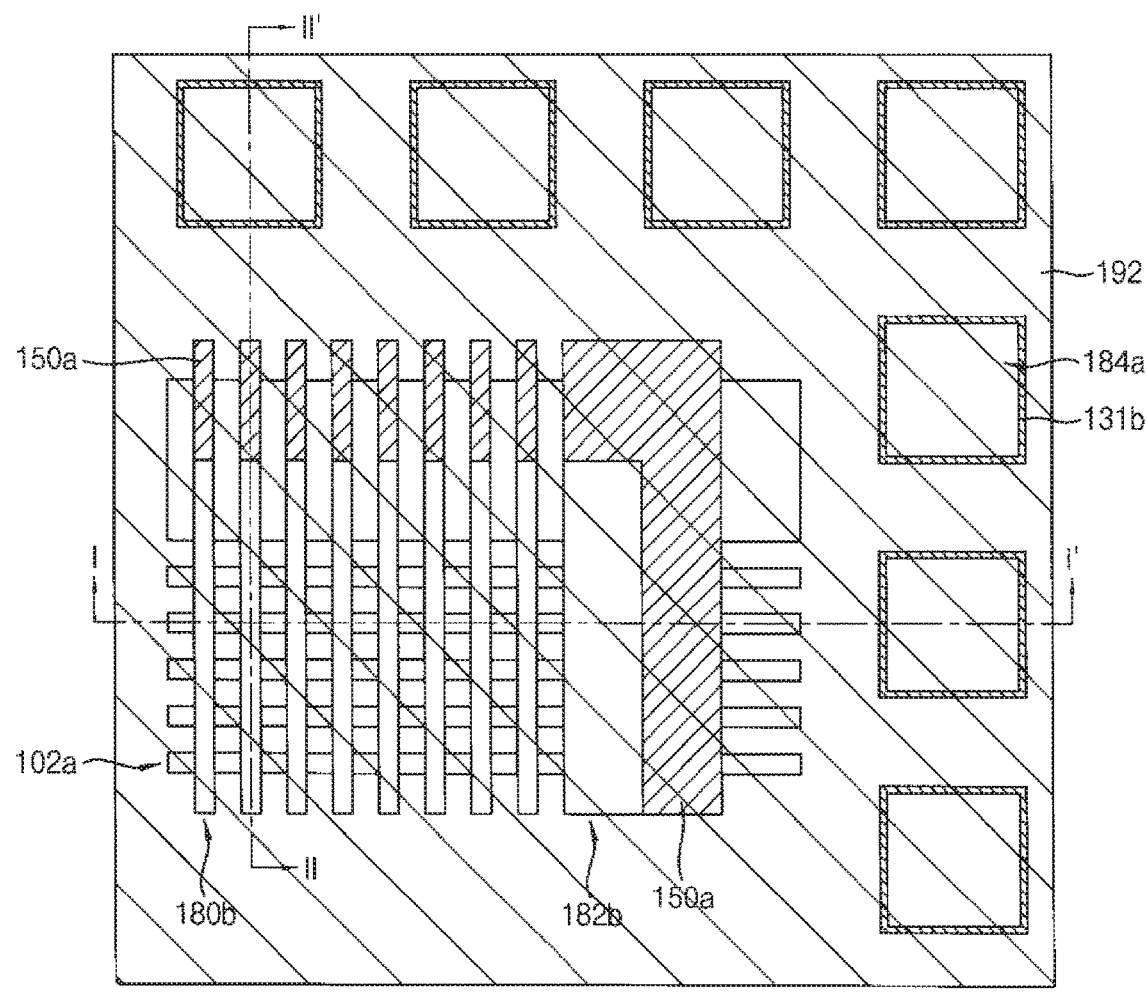

Referring to FIGS. 20 and 21, a third conductive layer 190 and a third hard mask layer 192 may be formed (e.g., sequentially formed) on the first upper structure 170a and 170b and the third and fourth insulating interlayers 186 and 189. The third conductive layer 190 and a third hard mask layer 192 and may be formed by, for example, a PVD process, an ALD process, a CVD process, etc.

The third conductive layer 190 may be formed to include a metal, such as tungsten, platinum, palladium, rhodium, ruthenium, iridium, copper, aluminum, titanium, tantalum, etc., or a metal nitride thereof. For example, the third conductive layer 190 may be formed to include a titanium nitride layer (not shown) and a tungsten layer (not shown) sequentially stacked.

The third hard mask layer 192 may be formed to include, for example, silicon nitride, silicon oxynitride, etc.

Figure 22:
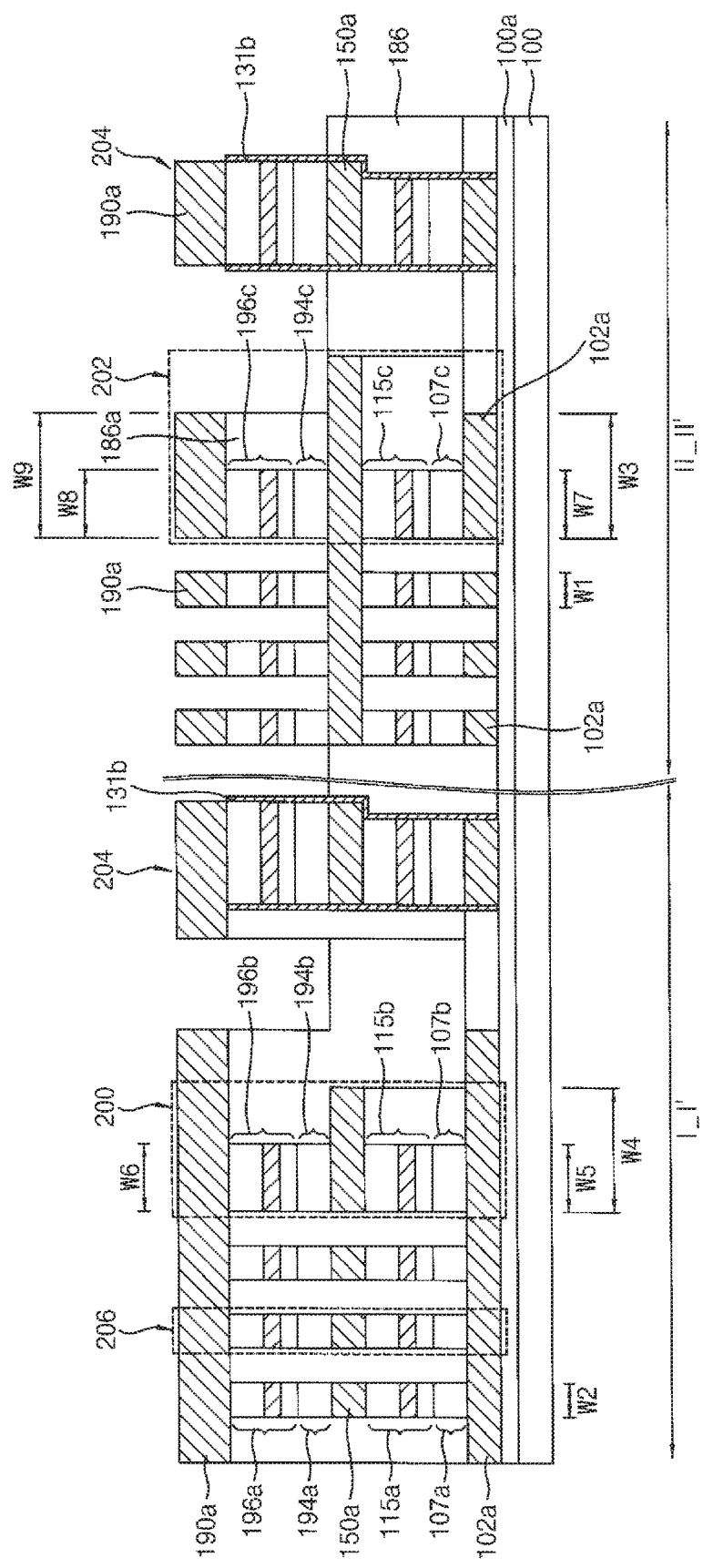
Figure 23:
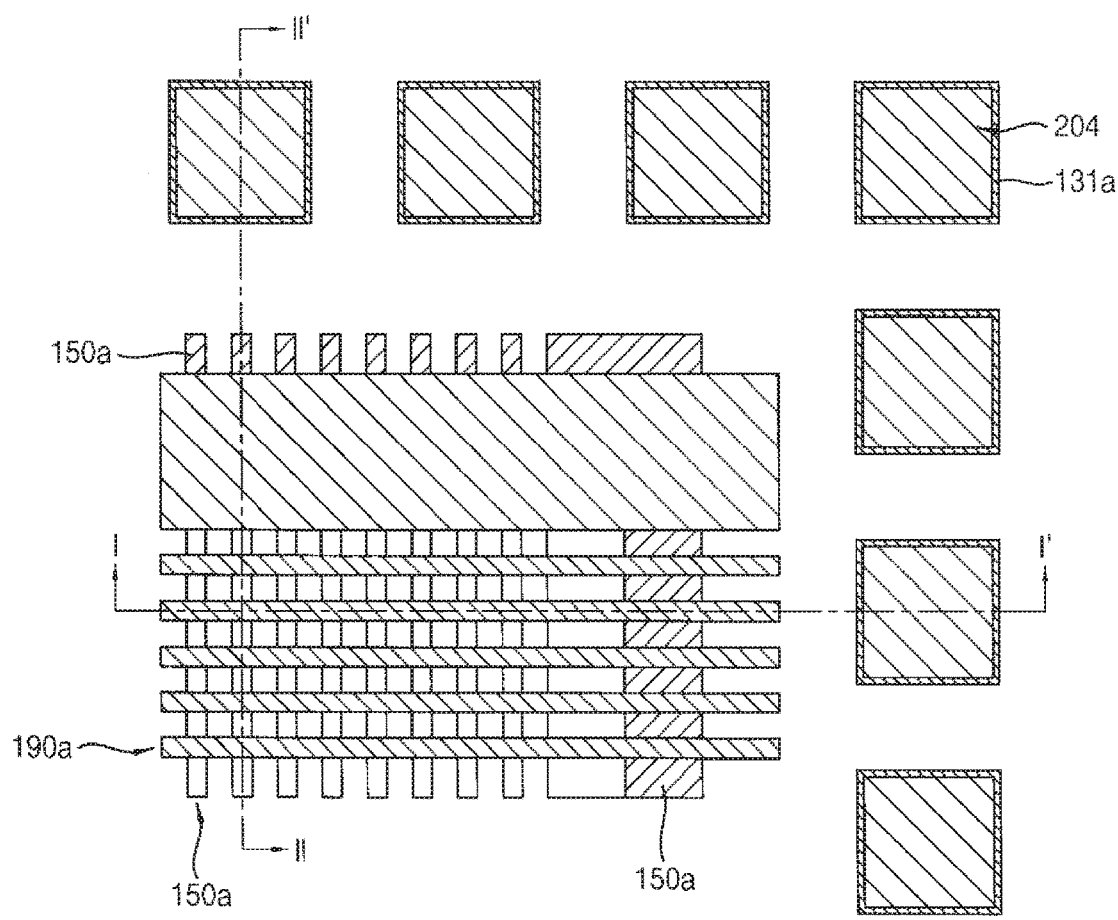

Referring to FIGS. 22 and 23, the third hard mask layer 192 may be etched to form a seventh hard mask (not shown), an eighth hard mask (not shown) and a ninth hard mask (not shown). The sixth to ninth hard masks may be formed to have shapes that are the same or substantially the same as shapes of the first to third hard masks 116a, 116b and 116c, respectively.

The first upper structures 170a and 170b included in the sixth preliminary structure 180a and the sixth preliminary dummy structure 180b may be anisotropically etched using the seventh to ninth hard masks as etching masks. In the etching process, the second conductive layer pattern 150a may serve as an etch stop layer. Thus, the first upper structure 170a on the cell region may have a pillar shape. Then, the seventh and ninth hard mask may be removed.

Thus, a first memory cell including the first conductive layer pattern 102a, the first switching element 107a, the first variable resistance element 115a, the second conductive layer pattern 150a, the second switching element 194, the second variable resistance element 196a, and third conductive layer pattern 190a may be formed on the cell region. A first dummy pattern structure 200 may be formed on both edge portions in the first direction of the dummy region, and the second dummy pattern structure 202 may be formed on both edge portions in the second direction of the dummy region.

The first dummy pattern structure 200 may include the first conductive layer pattern 102a, the third switching element 107b, the third variable resistance element 115b, the second conductive layer pattern 150a, the fourth switching element 196b, the fourth variable resistance element 196b and the third conductive layer pattern 190a, which are stacked sequentially. The second dummy pattern structure 202 may include the first conductive layer pattern 102a, the fifth switching element 107c, the fifth variable resistance element 115c, the second conductive layer pattern 150a, the sixth switching element 194c, the sixth variable resistance element 196c and the third conductive layer pattern 190a, which are stacked sequentially.

A blocking pattern 204 including the third etch residue 131a may be formed on the second region.

As described above, example embodiments of pattern structures on the first region may not include the etch residue. Thus, leakage currents due to the etch residue the may decrease.

Figure 24:
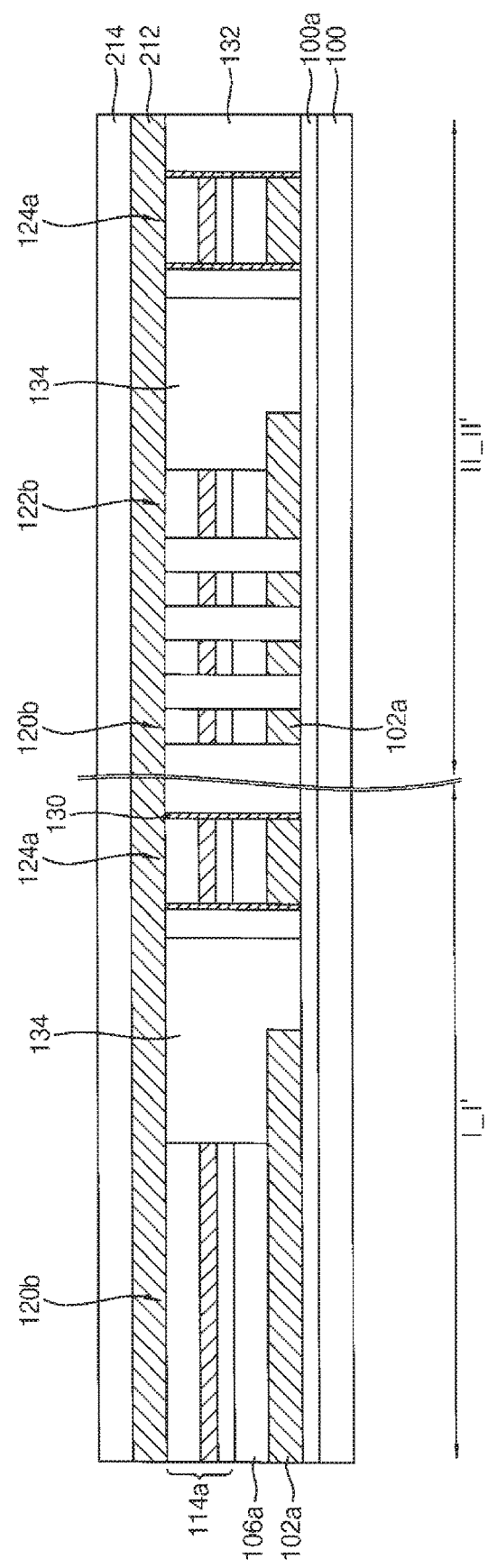

FIGS. 24 and 25 are cross-sectional views illustrating stages of a method of manufacturing a variable resistance memory device in accordance with one or more example embodiments.

The variable resistance memory device may be substantially the same as or similar to the variable resistance memory device illustrated with reference to FIGS. 1A and 1B, except that the variable resistance memory device has a single-stacked memory cell.

Referring to FIG. 24, processes substantially the same as or similar to those illustrated with reference to FIGS. 2 to 10 may be performed. Thus, a third preliminary structure 120b, a third preliminary dummy structure 122b and a second preliminary blocking pattern 124a may be formed on the insulation layer 100a of the substrate 100, respectively, and a second insulating interlayer layer 134 may be formed to fill spaces between the third preliminary structure 120b, the third preliminary dummy structure 122b and the second preliminary blocking pattern 124a.

A second conductive layer 212 and a second hard mask layer 214 may be formed (e.g., sequentially formed0 on the third preliminary structure 120b, the third preliminary dummy structure 122b and the second preliminary blocking pattern 124. Each of the second hard mask layer 214 and the second conductive layer 212 may be formed by, for example, a PVD process, an ALD process, a CVD process, etc.

Referring to FIG. 25, the second hard mask layer 214 may be etched to form a fourth hard mask (not shown), a fifth hard mask (not shown) and a sixth hard mask (not shown). The fourth to sixth hard mask may have a shape that is the same or substantially the same as a shape of the fourth to sixth hard mask 164a, 164b and 164c illustrated with reference to FIGS. 13 and 14. That is, for example, the fourth and fifth hard mask may extend in the second direction.

The fourth and fifth hard mask may be formed on the edge portion in the first direction of the first region, and the fourth hard mask may be formed on other region of the first region. The fifth hard mask pattern may be formed to have a width that is greater than a width of the fourth hard mask. The sixth hard mask may be formed to overlap the second preliminary blocking pattern 124a.

The second conductive layer 212, the first preliminary variable resistance pattern 114a, the first preliminary semiconductor layer pattern 106a and the first preliminary lower conductive layer pattern may be anisotropically etched using the fourth to sixth hard masks as etching masks. In the etching process, the first conductive layer pattern 102a may serve as an etch stop layer.

Thus, a first memory cell 216 may be formed on the first region using the fourth hard mask as an etching mask, and a first dummy pattern structure 220 and a second dummy pattern structure 222 may be formed on the first region using the fifth hard mask as an etching mask. A blocking pattern 224 may be formed on the second region using the sixth hard mask 164c as an etching mask.

The first memory cell 216 may include the first conductive layer pattern 102a, a first switching element 107a, a first variable resistance element 115a and a second conductive layer pattern 212a.

The first dummy pattern structure 220 may be formed on both edge portions in the first direction of the first region. The first dummy pattern structure 220 may include the first conductive layer pattern 102a, the second switching element 107b, the second variable resistance element 115b and the second conductive layer pattern 212a.

The second conductive layer pattern 212a of the first dummy pattern structure 220 may have a width in the first direction that is greater than a width in the first direction of the each of the second switching element 107b and the second variable resistance element 115b thereunder. Thus, the second conductive layer pattern 212a of the first dummy pattern structure 220 may protrude in the first direction from sidewalls of the first switching element 107a and the second variable resistance element 115b.

The second dummy pattern structure 222 may be formed on both edge portions in the second direction of the first region. The second dummy pattern structure 222 may include the first conductive layer pattern 102a, the first switching element 107c, the first variable resistance element 115c and the second conductive layer pattern 212a.

The first conductive layer pattern 102a of the second dummy pattern structure 222 may have a width in the second direction that is greater than a width in the second direction of the each of the third switching element 107c and the third variable resistance element 115c thereon. Thus, the first conductive layer pattern 102a of the second dummy pattern structure 222 may protrude in the second direction from sidewalls of the third switching element 107c and the third variable resistance element 115c.

An etch residue 130b may remain on the sidewall of the blocking pattern 224.

The variable resistance memory device may have the first conductive layer pattern 102a, a first memory cell 216, the second conductive layer pattern 212a that are the same or substantially the same as those illustrated with reference to FIGS. 1A and 1B, respectively. Also, the variable resistance memory device may have the first and second dummy pattern structures 220 and 222 that are the same or substantially the same as the first and second dummy pattern structures under the second conductive layer pattern those illustrated with reference to FIGS. 1A and 1B, respectively.

The variable resistance memory device may have no etch residue on the sidewalls of the first memory cell 216 and first and second dummy pattern structures 220 and 222. Thus, leakage currents due to the etch residue may decrease.

Figure 26A:
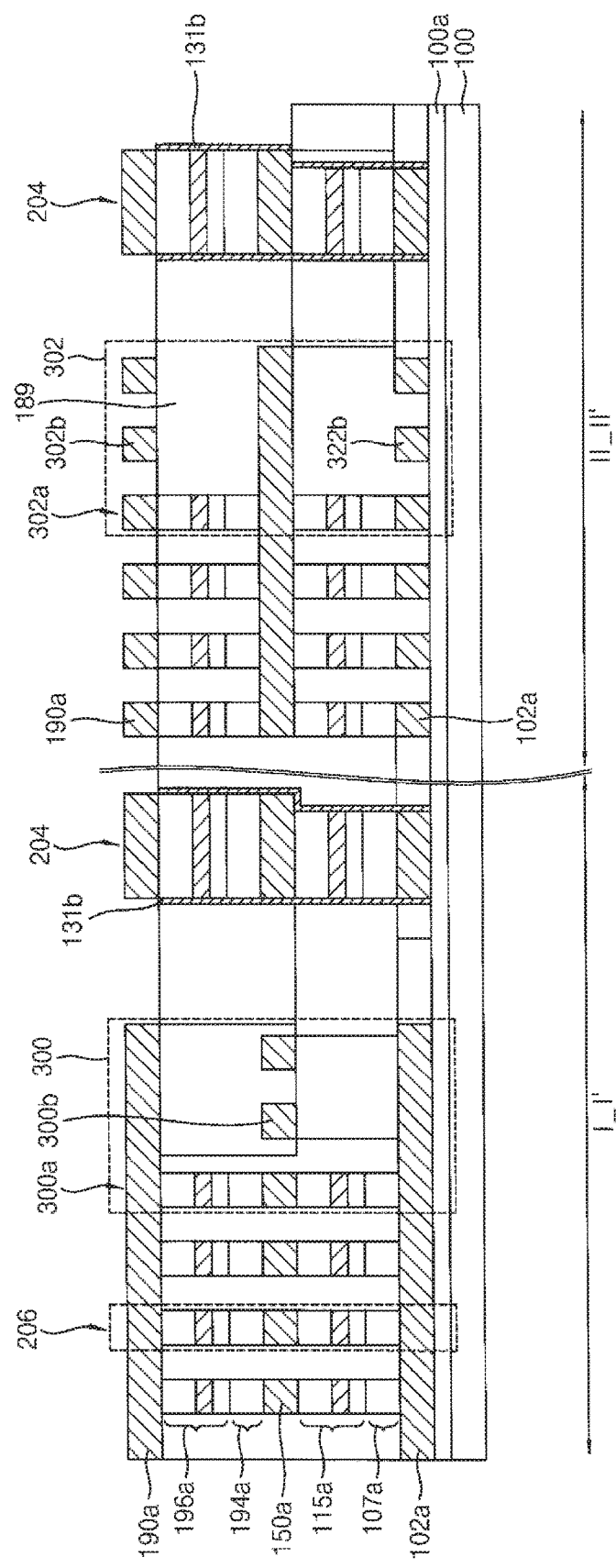
FIGS. 26A and 26B are a cross-sectional view and a plan view, respectively, illustrating a variable resistance memory device in accordance with one or more example embodiments.
Figure 26B:
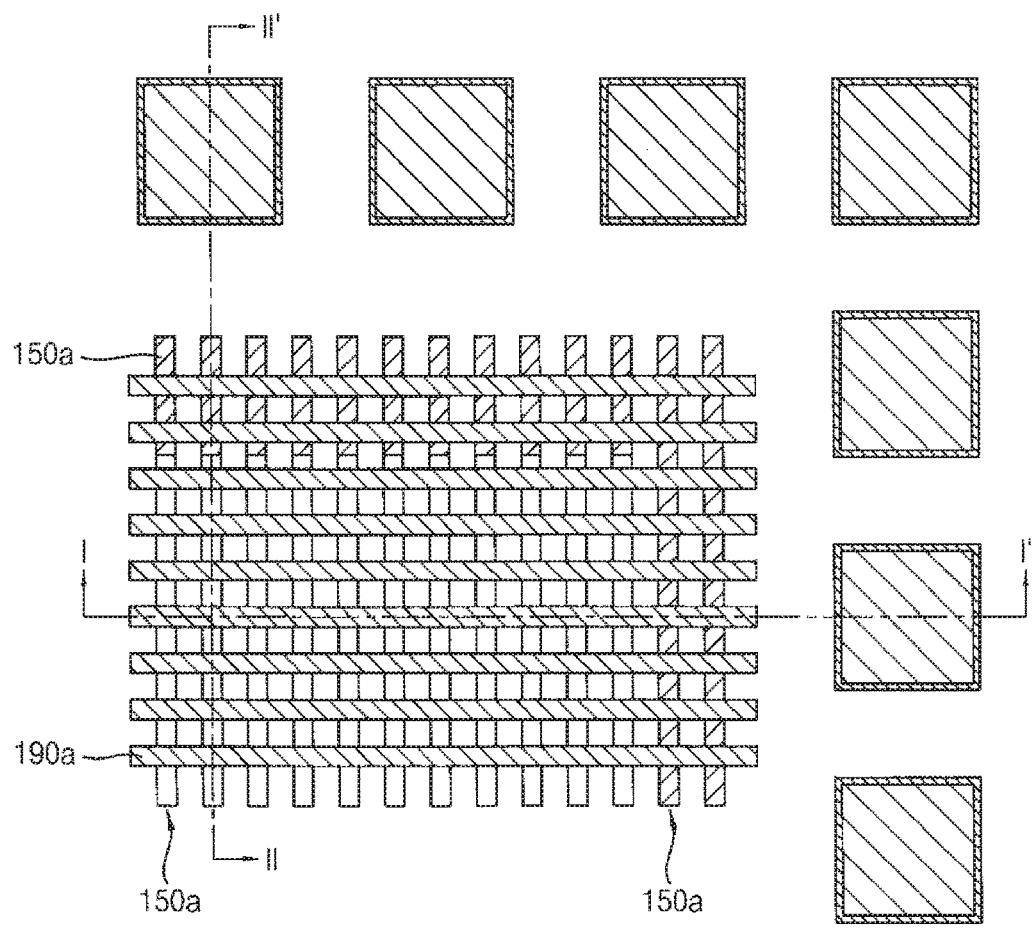

FIGS. 26A and 26B are a cross-sectional view and a plan view, respectively, illustrating a variable resistance memory device in accordance with one or more example embodiments. More particularly, FIG. 26A includes respective cross-sectional views of the variable resistance memory device taken along lines I-I' and II-II' in FIG. 26B.

The variable resistance memory device shown in FIGS. 26A to 26B may be substantially the same as or similar to the variable resistance memory device illustrated with reference to FIGS. 1A to 1B, except for the first dummy pattern structure and the second dummy pattern structure on the dummy region.

Referring to FIGS. 26A and 26B, the variable resistance memory device may be formed on a substrate 100 including a first region and a second region. The first region may include a cell region and a dummy region, and the second region may include other regions of the substrate 100. An insulation layer 100a may be formed on the substrate 100.

A first memory cell 206 serving as an actual memory cell may be formed on the cell region. The dummy region may be positioned at an edge portion of the first region, and may be adjacent to the cell region. A first dummy pattern structure 300 and a second dummy pattern structure 302 may be formed on the dummy region. The first dummy pattern structure 300 and the second dummy pattern structure 302 may not serve as actual memory cells.

The first memory cell 206 on the cell region may be the same, substantially the same as or similar to that illustrated with reference to FIGS. 1A and 1B.

Hereinafter, the first and second dummy pattern structure 300 and 302 on the dummy region will be described.

The first dummy pattern structure 300 may be formed on both edge portions in the first direction of the first region, and the second dummy pattern structure 302 may be formed on both edge portions in the second direction of the second region.

Each of patterns included in the first and second dummy pattern structures 300 and 302 may have a width that is the same or substantially the same as a width of each of the corresponding patterns included in the first memory cell 206.

The first dummy pattern structure 300 may include a first structure 300a having a stacked structure that is the same or substantially the same as that of the first memory cell 206, and a second structure 300b including a material that is the same or substantially the same as that of the second conductive layer pattern. The first structure 300a may be adjacent to the first memory cell 206, and the second structure 300b may be disposed outside of the first structure. In one or more example embodiments, the first structure 300a may not be formed, and only the second structure 300b may be formed.

The second dummy pattern structure 302 may include a third structure 302a having a stacked structure that is the same or substantially the same as that of the first memory cell 206, and a fourth structure 302b including a material that are the same or substantially the same as that of the second conductive layer pattern. The third structure 302a may be adjacent to the first memory cell 206, and the fourth structure 302b may be disposed outside of the third structure 302a. In one or more example embodiments, the third structure 302a may not be formed, and only the fourth structure 302b may be formed.

Peripheral circuits (not shown) and a blocking pattern 204 may be formed on the second region of the substrate 100. The blocking pattern 204 may be the same, substantially the same as or similar to that illustrated with reference to FIGS. 1A and 1B. Etch residues may be attached on the blocking pattern 204, however, the etch residues on the sidewalls of the blocking pattern 204 may not affect the electrical characteristics of the first memory cells 206.

FIGS. 27 to 36 are cross-sectional views and plan views illustrating a method of manufacturing a variable resistance memory device in accordance with one or more example embodiments. More particularly, each of the cross-sectional views may include cross-sections taken along lines I-I' and II-II', respectively, of a corresponding in plan view.

Figure 27:
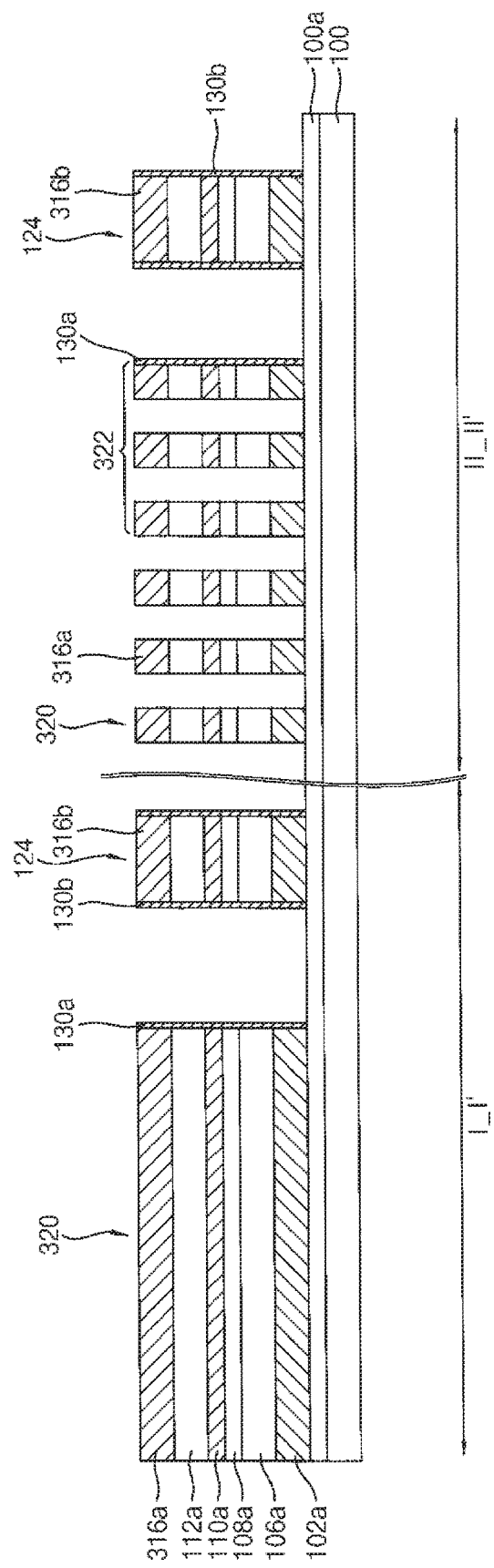
Figure 28:
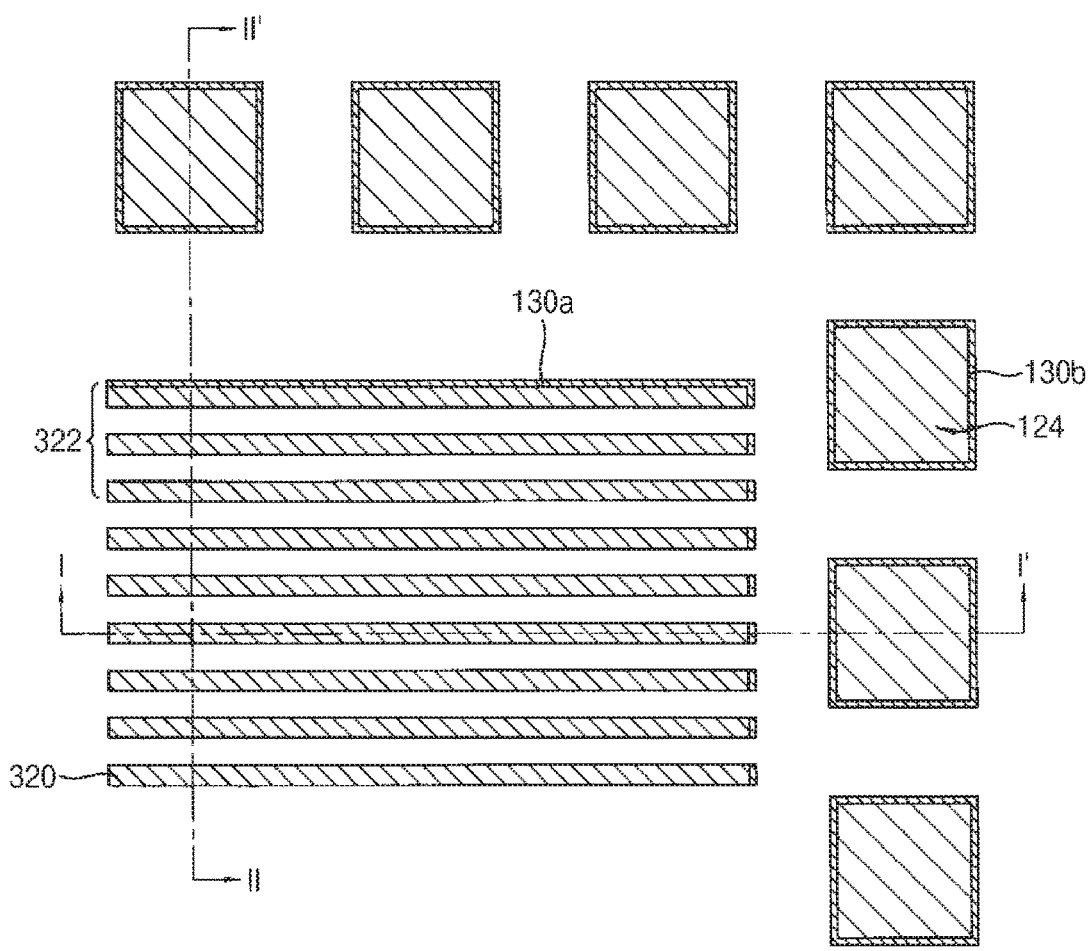

Referring to FIGS. 27 and 28, an insulation layer 100a may be formed on a substrate 100. A first conductive layer, a lower conductive layer (not shown), a first semiconductor layer, a first preliminary variable resistance structure and a first hard mask layer may be formed (e.g., sequentially formed) on the insulation layer 100a.

The first hard mask layer may be etched to form a first hard mask 316a on the first region and a second hard mask on the second region. The first hard mask 316a may extend in the first direction, and the second hard mask 316b may have a pillar shape.

The first preliminary variable resistance structure, the first semiconductor layer, the first lower conductive layer and the first conductive layer may be anisotropically etched using the first and second hard masks 316a and 316b as etching masks. Thus, a first preliminary structure 320 may be formed on the cell region and a first preliminary dummy structure 322 may be formed on the dummy region. A first preliminary blocking pattern 124 may be formed on the second region.

In one or more example embodiments, the first preliminary structure 320 may have a shape that is the same or substantially the same as a shape of the first preliminary dummy structure 322. That is, for example, the first preliminary structure 320 may have a width that is the same or substantially the same as a width of the first preliminary dummy structure 322.

A first etch residue 130a may be formed on sidewalls of the first preliminary structure 320 and the first preliminary dummy structure 322 adjacent to the second region. A second etch residue 130b may be formed on a sidewall of the first preliminary blocking pattern 124.

Figure 29:
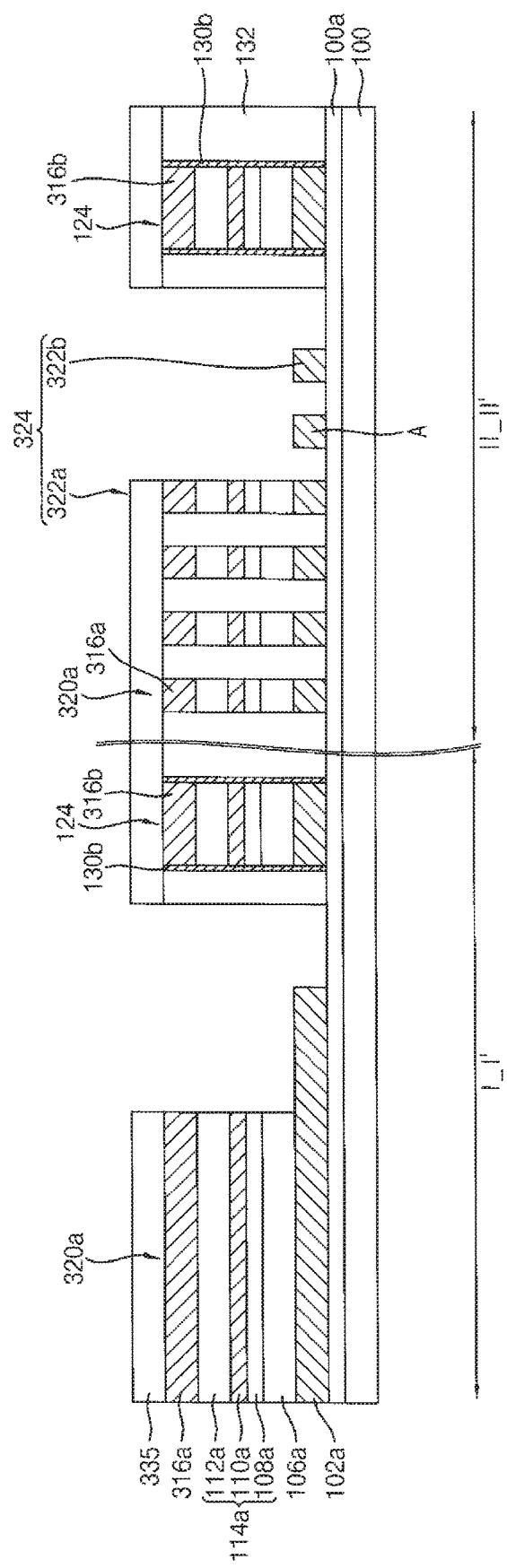
Figure 30:
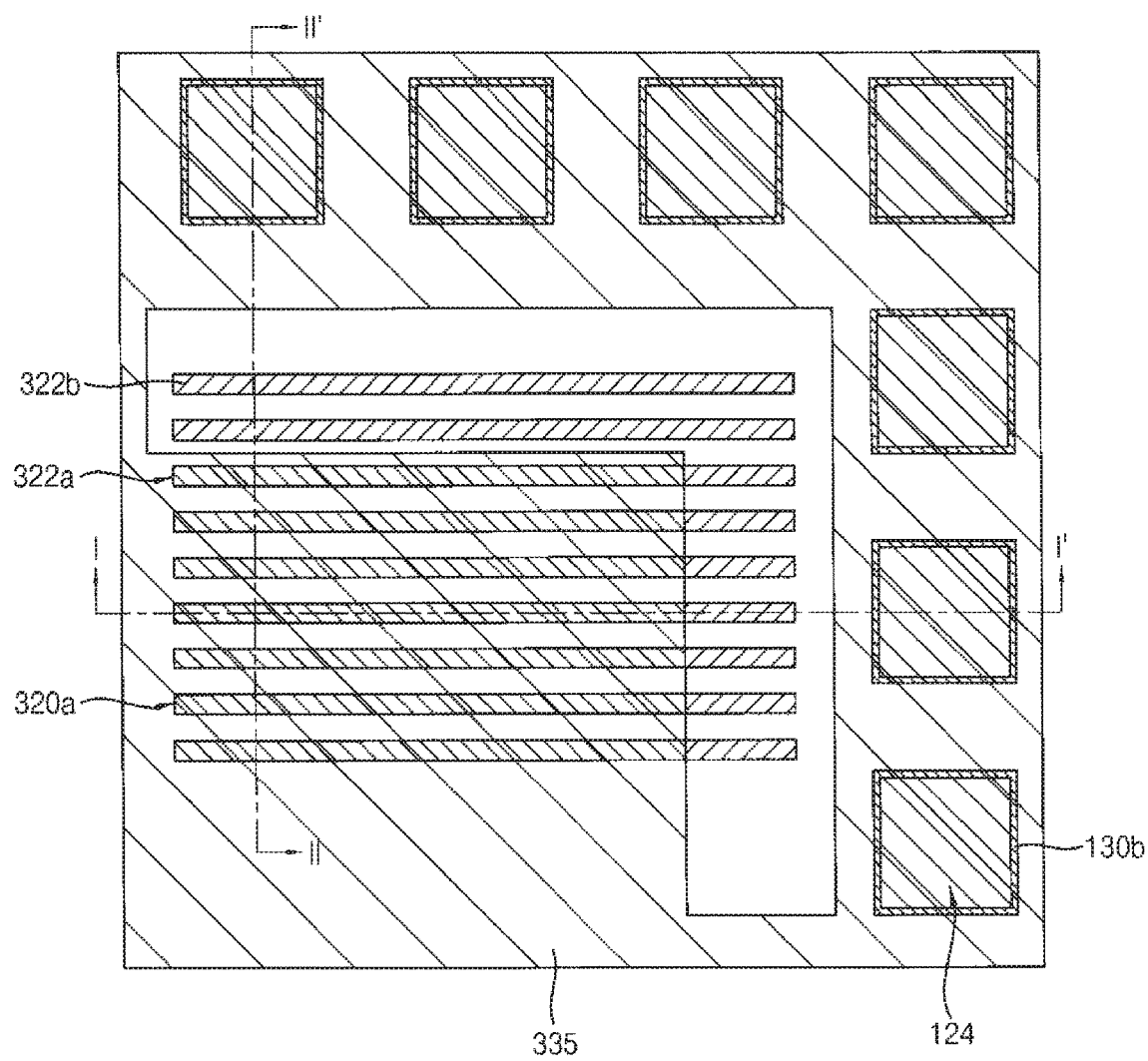

Referring to FIGS. 29 and 30, a first insulating interlayer 132 may be formed on the first insulation layer 100a to cover the first preliminary structure 320, the first preliminary dummy structure 322 and the first preliminary blocking pattern 324. The first insulating interlayer 132 may be planarized until top surfaces of the first preliminary structure 320, the first preliminary dummy structure 322 and the first preliminary blocking pattern 324 may be exposed.

A first mask layer (not shown) may be formed on the first preliminary structure 320, the first preliminary dummy structure 322, the first preliminary blocking pattern 124 and the first insulating interlayer 132. The first mask layer may be patterned to form a first mask 335, which may cover (e.g., entirely cover) the cell region and may expose a portion of the dummy region.

In one or more example embodiments, the first mask 335 may have a shape that is the same or substantially the same as a shape of the first mask 135 illustrated with reference to FIGS. 7 and 8. That is, for example, the first mask 335 may be formed to cover the first preliminary blocking pattern 124. Alternatively, the first mask 335 may be formed to expose the dummy region.

In one or more example embodiments, the first preliminary structure 320 and the preliminary dummy structure 332 and the first etch residue 130a on the edge portion of the first region may be exposed by the first mask 335.

The first preliminary dummy structure 320 and the first preliminary structure 332 may be anisotropically etched using the first mask 335 as an etching mask until a top surface of the first conductive layer pattern may be exposed. In the etching process, the first conductive layer pattern 102a may serve as an etching stop layer. During the etching process, the first etch residue 130a on the sidewalls of the first preliminary structure 320 and the first preliminary dummy structure 322 may be removed.

By the etching process, a second preliminary structure 320a may be formed on the cell region. The first preliminary dummy structure 322 exposed by the first mask 335 may be removed, so that the first conductive layer pattern 102a may remain on a portion of the dummy region. Thus, a second preliminary dummy structure 124 including a first preliminary pattern 322a and a first dummy pattern 322b may be formed on the dummy region, respectively. The first preliminary pattern 322a may have a shape that is the same or substantially the same as a shape of the second preliminary structure 320, and the first dummy pattern 322b may include a material that is the same or substantially the same as a material of the first conductive layer pattern 102a. In one or more example embodiments, when the dummy region is entirely exposed by the first mask 335, the first preliminary pattern 322a may not be formed, and only the first dummy pattern 322b may be formed. An etch residue may not include on sidewalls of the second preliminary structure 320a and the second preliminary dummy structure 324.

Figure 31:
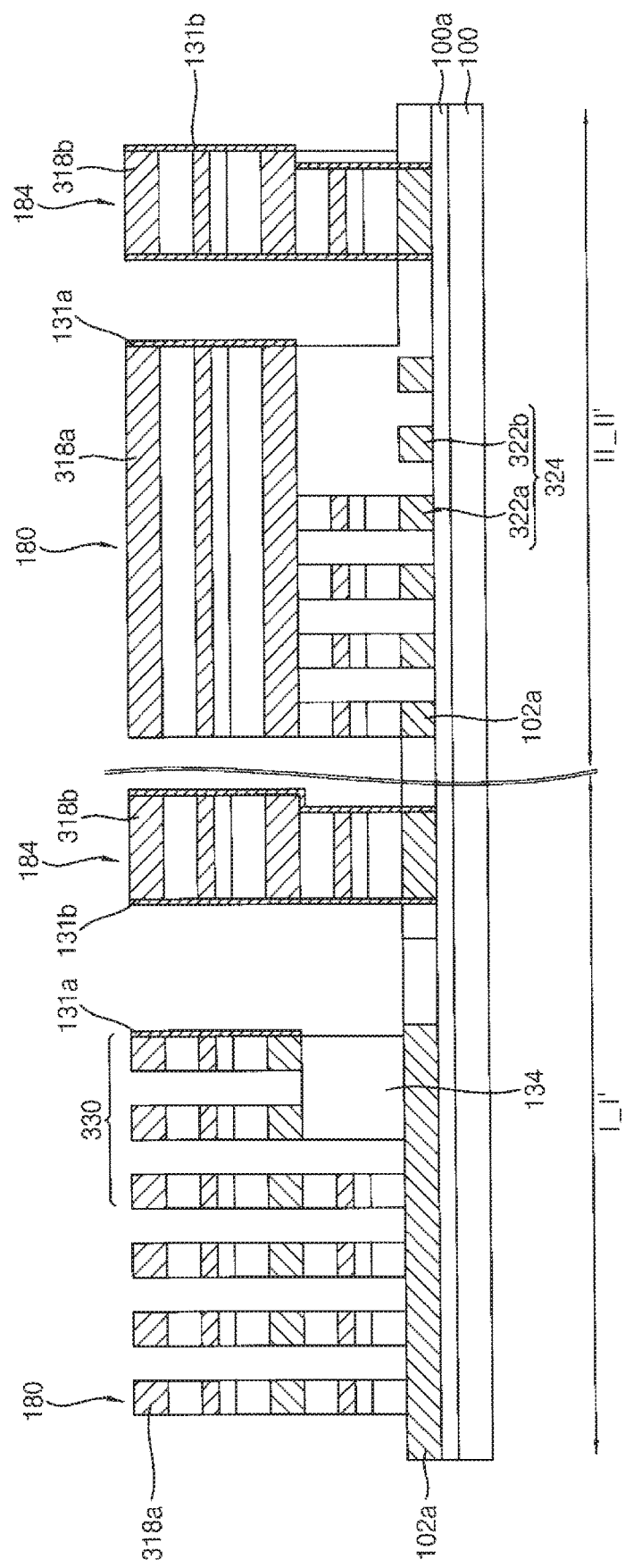
Figure 32:
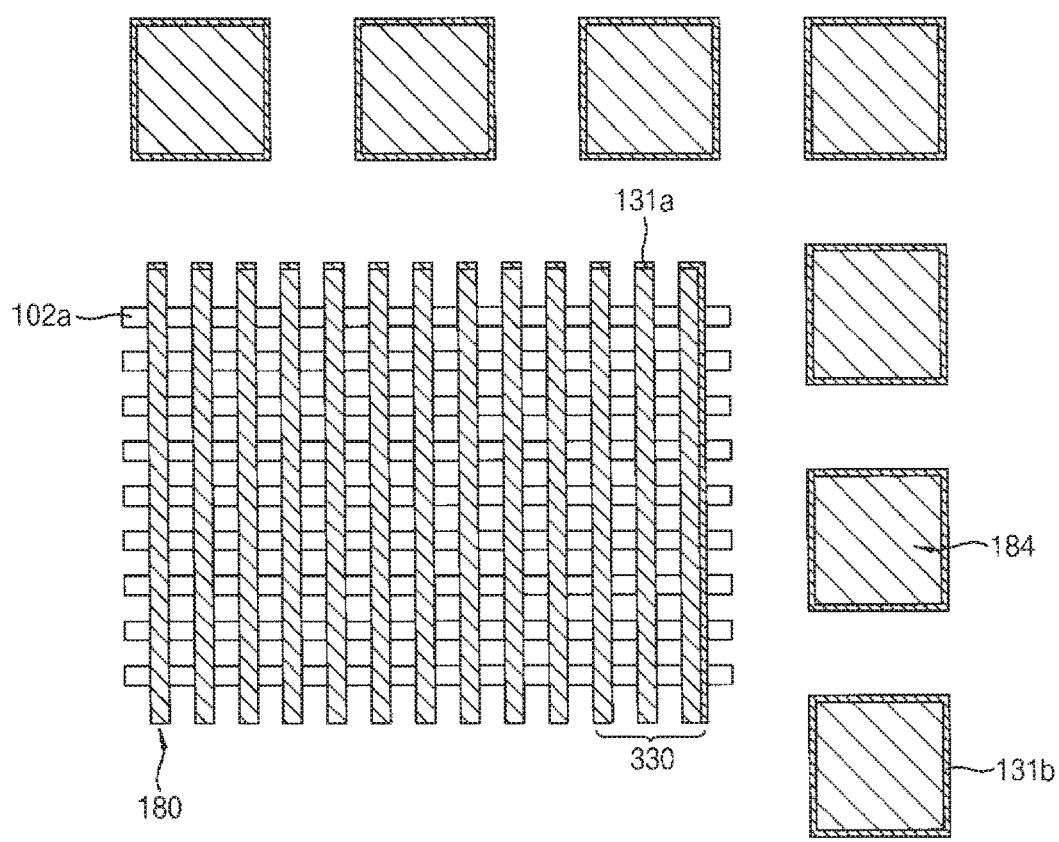

Referring to FIGS. 31 and 32, a second insulating interlayer 134 may be formed on the insulation layer 100a to cover the second preliminary structure 320a, the second preliminary dummy structure 324 and the first preliminary blocking pattern 124. The second insulating interlayer 134 may be planarized until the first and second hard masks 316a and 316b may be removed. In one or more example embodiments, portions of the first and second hard masks 316a and 316b may be removed after the planarization process. Thus, a third preliminary structure, a third preliminary dummy structure and a second preliminary blocking pattern may be formed on the insulation layer 100a.

A second conductive layer, a second lower conductive layer, a second semiconductor layer, a second preliminary variable resistance structure and a second hard mask layer may be formed (e.g., sequentially formed) on the first preliminary variable resistance pattern and the second insulating interlayer 134.

The second hard mask layer may be etched to form a third hard mask 318a on the first region and a fourth hard mask 318b on the second region.

The third hard mask 318a may extend in the second direction. The fourth hard mask 318b may overlap the second preliminary blocking pattern.

The second preliminary variable resistance structure, the second semiconductor layer, the second lower conductive layer, the second conductive layer, the first preliminary variable resistance pattern 114a, a first preliminary semiconductor pattern 106a and a first preliminary lower conductive pattern may be anisotropically etched using the third and fourth hard masks 318a and 318b as etching masks. In the etching process, the first conductive layer pattern 102a may serve as an etch stop layer.

Thus, a fourth preliminary structure 180 and a fourth preliminary dummy structure 330 may be formed on the first region, and a third preliminary blocking pattern 184 may be formed on the second region.

The fourth preliminary structure 180 and the fourth preliminary dummy structure 330 may have the same or substantially the same width.

A third residue 131a may be formed on sidewalls of the fourth preliminary structure 180 and the fourth preliminary dummy structure 330 adjacent to the second region. A fourth residue 131b may be formed on a sidewall of the third preliminary blocking pattern 184.

Figure 33:
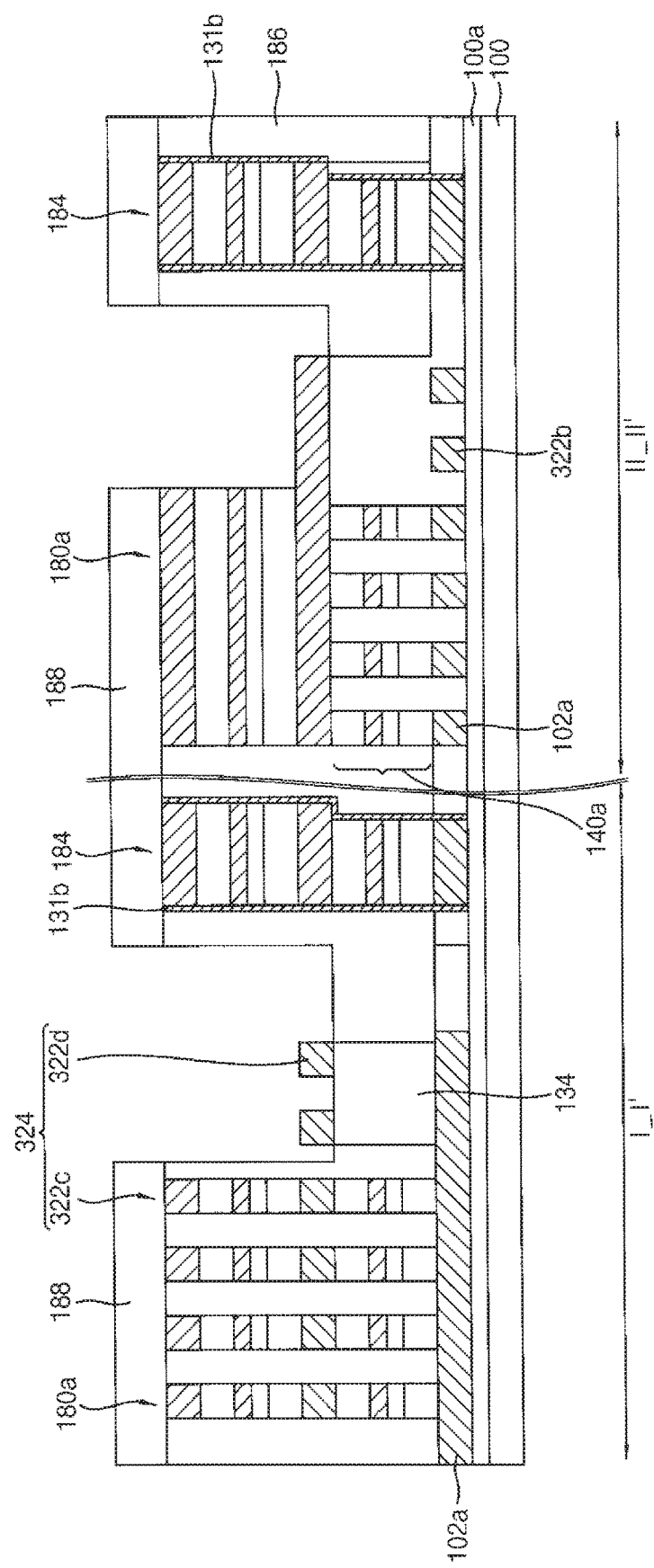
Figure 34:
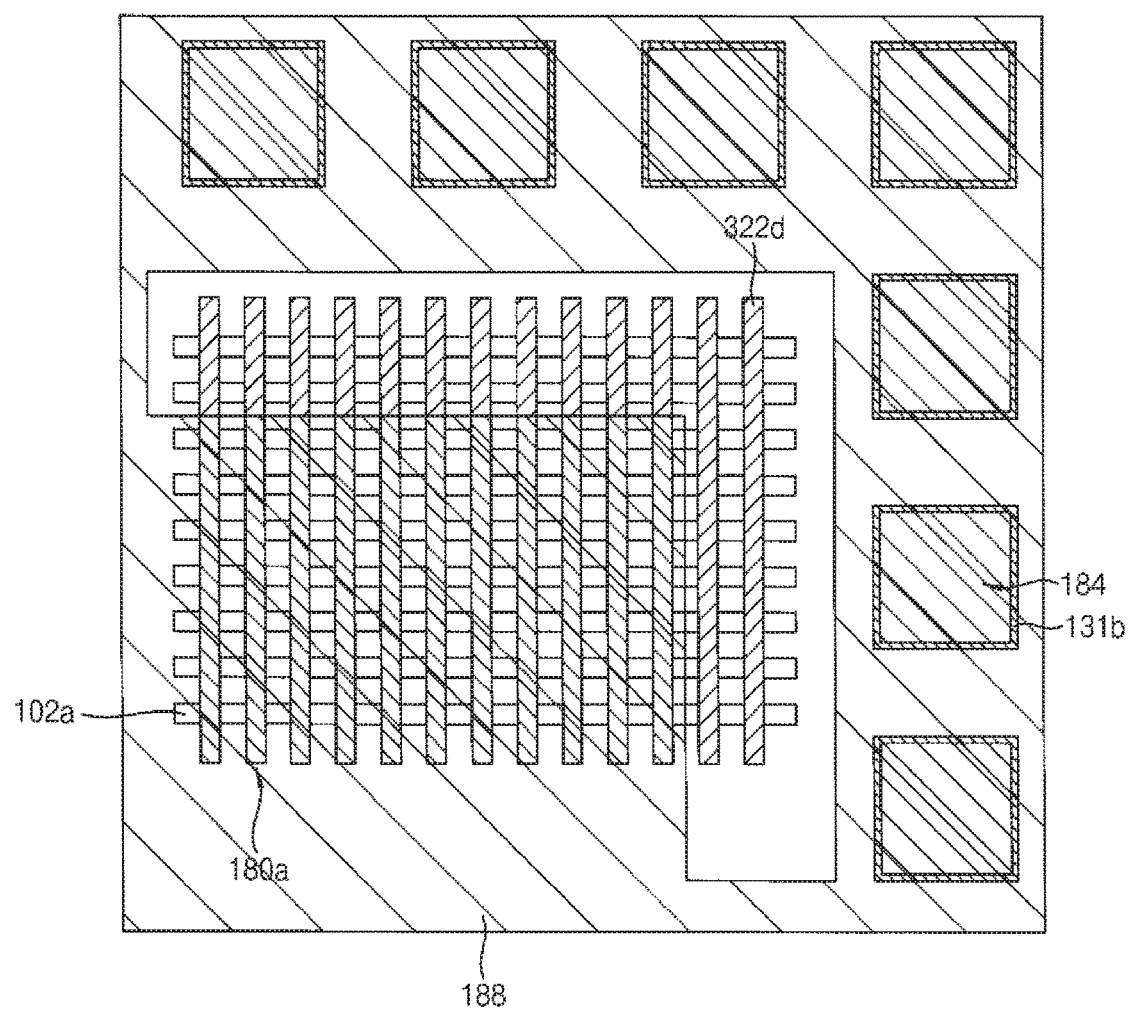

Referring to FIGS. 33 and 34, a third insulating interlayer 186 may be formed on the insulation layer 100a to cover the fourth preliminary structure 180, the fourth preliminary dummy structure 330 and the third preliminary blocking pattern 184. The third insulating interlayer 186 may be planarized until top surfaces of the fourth preliminary structure 180, the fourth preliminary dummy structure 330 and the third preliminary blocking pattern 184 may be exposed.

The second mask layer (not shown) may be formed on the fourth preliminary structure 180, the fourth preliminary dummy structure 330 and the third preliminary blocking pattern 184. The second mask layer may be patterned to form a second mask 188, which may cover (e.g., entirely cover) the cell region, and may expose a portion of the dummy region. In one or more example embodiments, the second mask 188 may be formed to have a shape that is the same or substantially the same as a shape of the first mask 335.

The fourth preliminary dummy structure 330 and the fourth preliminary structure 180 may be anisotropically etched using the second mask 188 as an etching mask until a top surface of the second conductive layer pattern 150a may be exposed. In the etching process, the second conductive layer pattern 150a may serve as an etch stop layer. During the etching process, the third etch residue 131a on the sidewalls of the fourth preliminary structure 180 and the fourth preliminary dummy structure 330 may be removed.

Thus, a fifth preliminary structure 180a and a fifth preliminary dummy structure 324 may be formed on the first region, respectively.

The fourth preliminary dummy structure 330 exposed by the second mask 188 may be etched, so that the second conductive pattern 150a may remain on a portion of the dummy region. Thus, the second preliminary pattern 322c and a second dummy pattern 322d may be formed on the dummy region. The second preliminary pattern 322c may have a shape that is the same or substantially the same as a shape of the fourth preliminary structure 180, and the second dummy pattern 322d may have a material that is the same or substantially the same as a material of the second conductive pattern 150a. In one or more example embodiments, when the dummy region is entirely exposed by the second mask 188, the second preliminary pattern may not be formed, and only the second dummy pattern 322d may be formed.

The fifth preliminary structure 180a and the fifth preliminary dummy structure 324a may not include the third etch residue. The fourth etch residue 131b may be attached on the sidewall of the third preliminary blocking pattern 184, however, the fourth etch residue 131b may not affect the electrical characteristics of memory cells.

Figure 35:
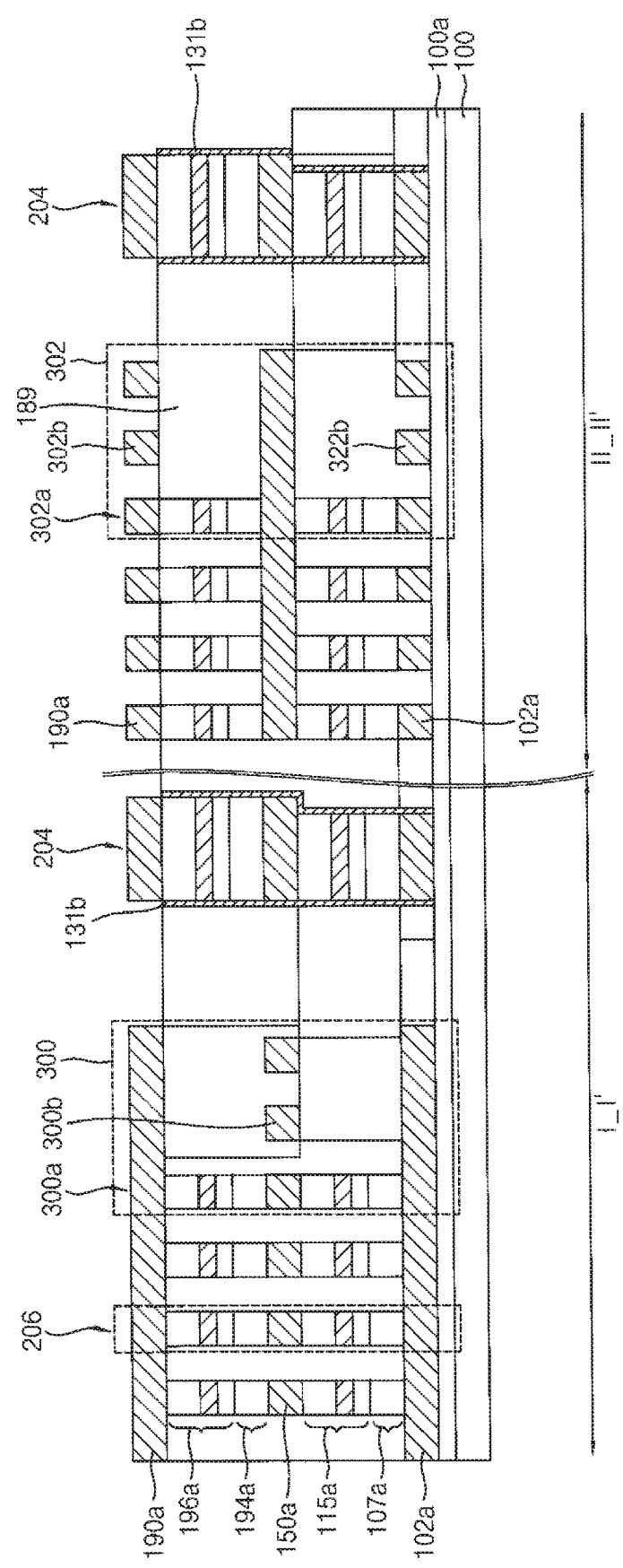
Figure 36:
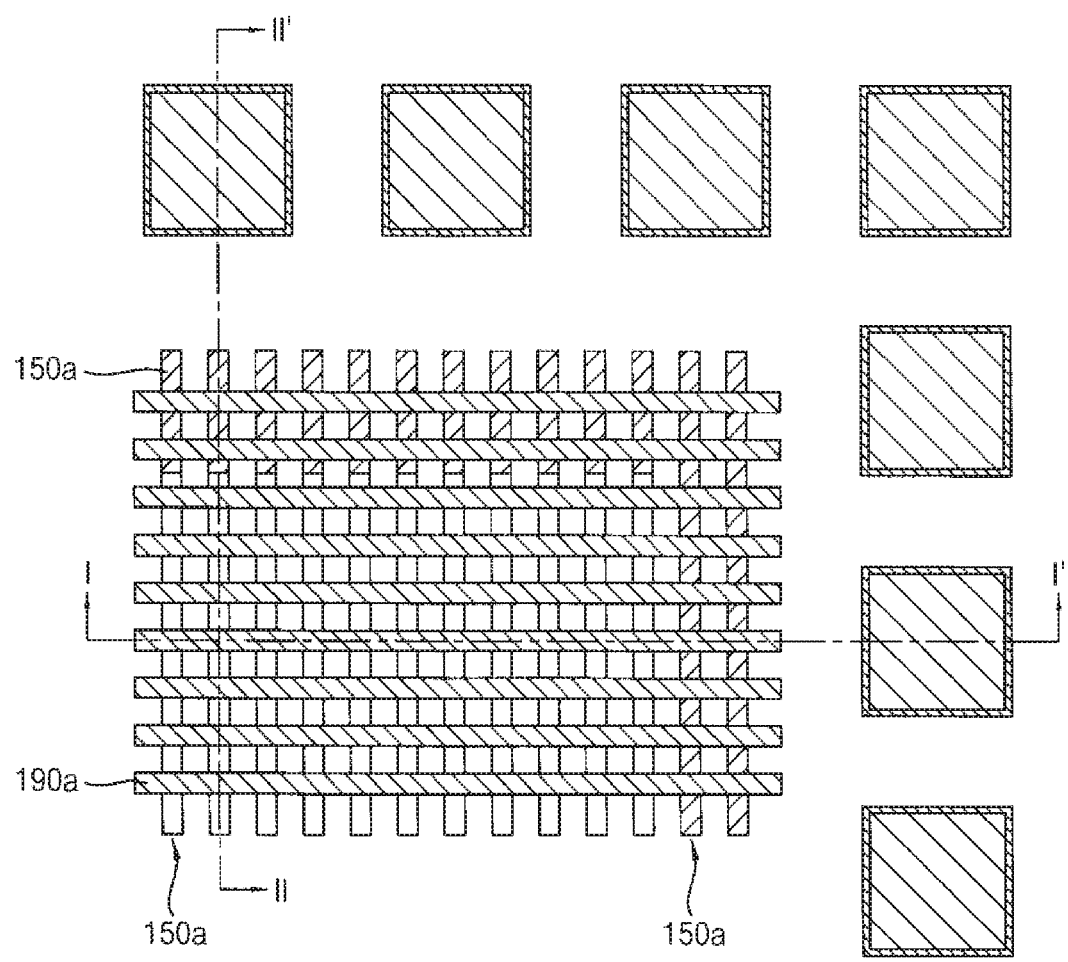

Referring to FIGS. 35 and 36, a fourth insulating interlayer 189 may be formed on the insulation layer 100a to cover the fifth preliminary structure 180a, the fifth preliminary dummy structure 324a and the third preliminary blocking pattern 184. The fourth insulating interlayer 189 may be planarized and/or etched until the third and fourth hard masks 318a and 318b may be removed to form a sixth preliminary structure, a sixth preliminary dummy structure and a fourth preliminary blocking pattern.

A third conductive layer and a third hard mask layer may be formed (e.g., sequentially formed) on the second preliminary variable resistance structure and the third and fourth insulating interlayers 186 and 189.

The third hard mask layer may be etched to form a fourth hard mask (not shown) and fifth hard mask (not shown), respectively. The fourth and fifth hard masks may be formed to have shapes that are the same or substantially the same as shapes of the first and second hard masks 316a and 316b, respectively.

The sixth preliminary structure and the sixth preliminary dummy structure may be anisotropically etched using the fourth and fifth hard masks as etching masks until a top surface of the second conductive layer pattern 150a may be exposed. In the etching process, the second conductive layer pattern 150a may serve as an etch stop layer. Then, the fourth and fifth hard masks may be removed.

Thus, a first memory cell 206 may be formed on the cell region, and may be the same or substantially the same as the first memory cell illustrated with reference to FIGS. 1A and 1B.

A first dummy pattern structure 300 may be formed on both edge portions in the first direction of the dummy region. The first dummy pattern structure 300 may include a first structure 300a and a second structure 300b. The first structure 300a may have a stacked structure and shape that is the same or substantially the same as a stacked structure and shape of the first memory cell 206, respectively. The second structure 300b may include a material that is the same or substantially the same as a material of the second conductive layer pattern 150a. The first structure 300a may be adjacent to the first memory cell 206, and the second structure 300b may be disposed outside of the first structure 300a. In one or more example embodiments, the first structure 300a may not be formed, and only the second structure 300b may be formed.

A second dummy pattern structure 302 may be formed on both edge portions in the second direction of the dummy region. The second dummy pattern structure 302 may include a third structure 302a and a fourth structure 302b. The third structure 302a may have a stacked structure and shape that is the same or substantially the same as a stacked structure and shape of the first memory cell 206, respectively. The fourth structure 302b may have a first dummy pattern 322b including a material that is the same or substantially the same as a material of the first conductive layer pattern 102a, and a pattern 302b including a material that is the same or substantially the same as a material of the third conductive layer pattern 190a.

A blocking pattern 131b may be formed on the second region, and a fourth etch residue may be attached on a sidewall of the blocking pattern 131b.

Thus, etch residues on sidewalls of pattern structures on the first region may be removed, so that the pattern structures on the first region may not include the etch residues. Thus, leakage currents due to the etch residues the may decrease.

Variable resistance memory devices and methods of manufacturing the same, according to one or more example embodiments, may be applied to various types of memory devices including diodes as selection elements and having cross-point array structures. That is, for example, variable resistance memory devices and methods of manufacturing the same, according to one or more example embodiments, may be applied to memory devices, such as ReRAM device, PRAM device, MRAM device, etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the example embodiments. Accordingly, all such modifications are intended to be included within the scope of the example embodiments as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A variable resistance memory device, comprising:
a plurality of first conductive layer patterns extending in a first direction;
a plurality of second conductive layer patterns over the plurality of first conductive layer patterns, the plurality of second conductive layer patterns extending in a second direction to cross the plurality of first conductive layer patterns; and
a plurality of lower cell structures formed at intersections of the plurality of first conductive layer patterns and the plurality of second conductive layer patterns, each of the plurality of lower cell structures including a lower switching element and a lower variable resistance element,
wherein the plurality of first conductive layer patterns, the plurality of second conductive layer patterns and the plurality of lower cell structures form a plurality of pattern structures, each of the plurality of pattern structures serving as one of a memory cell, a first dummy pattern structure and a second dummy pattern structure of the variable resistance memory device,
wherein the first dummy pattern structure is formed on at least a first edge portion in the first direction, and a second conductive layer pattern of the first dummy pattern structure protrudes in the first direction from a sidewall of a lower cell structure of the first dummy pattern structure, and
wherein the second dummy pattern structure is formed on at least a second edge portion in the second direction, and a first conductive layer pattern of the second dummy pattern structure protrudes in the second direction from a sidewall of a lower cell structure of the second dummy pattern structure.

2. The variable resistance memory device of claim 1, wherein
a second conductive layer pattern of the memory cell has a first width in the first direction; and
the second conductive layer pattern of the first dummy pattern structure has a second width in the first direction, the second width being greater than the first width.

3. The variable resistance memory device of claim 2, wherein
a lower cell structure of the memory cell has the first width in the first direction; and
the lower cell structure of the second dummy pattern structure has a third width in the first direction, the third width being greater than the first width.

4. The variable resistance memory device of claim 1, wherein
a first conductive layer pattern of the memory cell has a first width in the second direction; and
the first conductive layer pattern of the second dummy pattern structure has a second width in the second direction, the second width being greater than the first width.

5. A variable resistance memory device, comprising:
a substrate including a cell region and a dummy region adjacent to an edge portion of the cell region;
a plurality of first conductive layer patterns extending in a first direction;
a plurality of lower cell structures on the plurality of first conductive layer patterns, each of the plurality of lower cell structures including a lower switching element and a lower variable resistance element, and each of the plurality of lower cell structures having a pillar shape; and
a plurality of second conductive layer patterns on the plurality of lower cell structures, the plurality of second conductive layer patterns extending in a second direction,
wherein the second direction crosses the first direction,
wherein the plurality of first conductive layer patterns, the plurality of second conductive layer patterns and the plurality of lower cell structures define a pattern structure on the cell region and the dummy region,
wherein a shape of at least one of a first conductive layer pattern and a second conductive layer pattern on the dummy region is different from a shape of at least one of a first conductive layer pattern and a second conductive layer pattern on the cell region, and wherein at least one of the first conductive layer pattern on the dummy region protrudes in the second direction from a first sidewall of a first lower cell structure on the first conductive layer pattern, and the second conductive layer pattern on the dummy region protrudes in the first direction from a second sidewall of a second lower cell structure under the second conductive layer pattern on the dummy region.

6. The variable resistance memory device of claim 5, wherein the second conductive layer pattern on the dummy region is at an edge portion of the dummy region in the first direction, and the shape of the second conductive layer pattern on the dummy region is different from the shape of the second conductive layer pattern on the cell region; and the first conductive layer pattern on the dummy region is at an edge portion of the dummy region in the second direction, and the shape of the first conductive layer pattern on the dummy region is different from the shape of the first conductive layer pattern on the cell region.

7. The variable resistance memory device of claim 5, wherein the second conductive layer pattern on the dummy region is at an edge portion of the dummy region in the first direction; and a width of the second conductive layer pattern on the dummy region in the first direction is greater than a width of the second conductive layer pattern on the cell region in the first direction.

8. The variable resistance memory device of claim 5, wherein the first conductive layer pattern on the dummy region is at an edge portion of the dummy region in the second direction; and a width of the first conductive layer pattern on the dummy region in the second direction is greater than a width of the first conductive layer pattern on the cell region in the second direction.

9. The variable resistance memory device of claim 5, wherein the second conductive layer pattern on the dummy region is at an edge portion of the dummy region in the first direction.

10. The variable resistance memory device of claim 5, wherein the first conductive layer pattern on the dummy region is at an edge portion of the dummy region in the second direction.

11. The variable resistance memory device of claim 5, wherein at least a portion of the pattern structure on the dummy region has a first stacked structure;

at least a portion of the pattern structure on the cell region has a second stacked structure; and the first and second stacked structures are substantially the same.

12. The variable resistance memory device of claim 5, wherein at least a portion of the pattern structure on the dummy region has a first stacked structure;

at least a portion of the pattern structure on the cell region has a second stacked structure; and the first and second stacked structures are different.

13. A resistive memory device, comprising:

a plurality of first conductive layer patterns extending in a first direction;

a plurality of second conductive layer patterns over the plurality of first conductive layer patterns, the plurality of second conductive layer patterns extending in a second direction to cross the plurality of first conductive layer patterns; and a plurality of lower cell structures formed at intersections of the plurality of first conductive layer patterns and the plurality of second conductive layer patterns, each of the plurality of lower cell structures including a lower switching element and a lower variable resistance element, wherein the plurality of first conductive layer patterns, the plurality of second conductive layer patterns and the plurality of lower cell structures form a plurality of pattern structures, each of the plurality of pattern structures serving as one of a memory cell, a first dummy pattern structure and a second dummy pattern structure of the resistive memory device, wherein the memory cell, the first dummy pattern structure and the second dummy pattern structure have substantially the same stacked structures as one another, wherein the first dummy pattern structure is formed on at least a first edge portion in the first direction, and a second conductive layer pattern of the first dummy pattern structure protrudes in the first direction from a sidewall of a lower cell structure of the first dummy pattern structure, and wherein the second dummy pattern structure is formed on at least a second edge portion in the second direction, and a first conductive layer pattern of the second dummy pattern structure protrudes in the second direction from a sidewall of a lower cell structure of the second dummy pattern structure.

14. The resistive memory device of claim 13, wherein a width of at least a portion of the first dummy pattern structure is different from a width of the memory cell.

15. The resistive memory device of claim 14, wherein a width of a second conductive layer pattern of the first dummy pattern structure in the first direction is different from a width of the second conductive layer pattern of the memory cell in the first direction.

16. The resistive memory device of claim 15, wherein the width of the second conductive layer pattern of the first dummy pattern structure in the first direction is greater than the width of the second conductive layer pattern of the memory cell in the first direction.

17. The resistive memory device of claim 15, wherein a width of a lower cell structure of the second dummy pattern structure in the first direction is different from a width of the lower cell structure of the memory cell in the first direction.

18. The resistive memory device of claim 17, wherein the width of the lower cell structure of the second dummy pattern structure in the first direction is greater than the width of the lower cell structure of the memory cell in the first direction.

19. The resistive memory device of claim 17, wherein a width of a first conductive layer pattern of the second dummy pattern structure in the second direction is different from a width of the first conductive pattern of the memory cell in the second direction.

20. The resistive memory device of claim 19, wherein the width of the first conductive pattern of the second dummy structure in the second direction is greater than the width of the first conductive pattern of the memory cell in the second direction.

* * * * *